US012796336B2

(12) United States Patent
Kitagawa

(10) Patent No.: US 12,796,336 B2
(45) Date of Patent: Nov. 10, 2026

(54) MEMORY DEVICE AND METHOD OF MANUFACTURING THE SAME

(71) Applicant: Kioxia Corporation, Tokyo (JP)

(72) Inventor: Eiji Kitagawa, Seoul (KR)

(73) Assignee: Kioxia Corporation, Tokyo (JP)

( * ) Notice: Subject to any disclaimer, the term of this patent is extended or adjusted under 35 U.S.C. 154(b) by 568 days.

(21) Appl. No.: 18/335,205

(22) Filed: Jun. 15, 2023

(65) Prior Publication Data

US 2024/0081156 A1 Mar. 7, 2024

(30) Foreign Application Priority Data

Sep. 7, 2022 (JP) ................................ 2022-142460

(51) Int. Cl.
*H10N 50/80* (2023.01)
*H10B 61/00* (2023.01)
*H10N 50/01* (2023.01)
*H10N 50/20* (2023.01)

(52) U.S. Cl.
CPC ............ *H10N 50/80* (2023.02); *H10B 61/00* (2023.02); *H10N 50/01* (2023.02); *H10N 50/20* (2023.02)

(58) Field of Classification Search
CPC ............................... H10N 50/80; H10N 50/10
See application file for complete search history.

(56) References Cited

U.S. PATENT DOCUMENTS

| | | | |
|---|---|---|---|
| 8,716,818 B2 | 5/2014 | Yoshikawa et al. | |
| 8,828,742 B2 | 9/2014 | Iba | |
| 9,117,924 B2 | 8/2015 | Kitagawa et al. | |
| 11,276,816 B2 | 3/2022 | Zhao et al. | |
| 2016/0380189 A1 | 12/2016 | Ohsawa et al. | |
| 2017/0125668 A1 | 5/2017 | Paranjpe et al. | |
| 2020/0091411 A1 | 3/2020 | Sonoda | |
| 2021/0111333 A1 | 4/2021 | Chang et al. | |
| 2021/0343930 A1* | 11/2021 | Hsu | H01F 41/32 |
| 2021/0389395 A1 | 12/2021 | Suemitsu et al. | |
| 2022/0085278 A1 | 3/2022 | Igarashi | |

FOREIGN PATENT DOCUMENTS

| | | | |
|---|---|---|---|
| JP | 2013016587 | A | 1/2013 |
| JP | 2013201343 | A | 10/2013 |
| JP | 5575198 | B2 | 8/2014 |
| JP | 5601181 | B2 | 8/2014 |
| JP | 6829316 | B2 | 1/2021 |
| TW | 201733176 | A | 9/2017 |
| TW | 202013675 | A | 4/2020 |
| TW | 202213343 | A | 4/2022 |
| TW | I770494 | B | 7/2022 |
| WO | 2020095785 | A1 | 5/2020 |

* cited by examiner

*Primary Examiner* — Matthew L Reames
(74) *Attorney, Agent, or Firm* — Holtz, Holtz & Volek PC

(57) ABSTRACT

A memory device includes a first ferromagnetic layer; a second ferromagnetic layer; a first insulating layer between the first ferromagnetic layer and the second ferromagnetic layer; a first oxide; a second oxide; and a silicon nitride. The first oxide is over a side surface of the first ferromagnetic layer, a side surface of the first insulating layer, and a side surface of the second ferromagnetic layer. The second oxide is over the first oxide, and includes a magnesium oxide, an aluminum oxide, a silicon oxide, or an alkaline-earth metal oxide. The silicon nitride is over a side surface of the second oxide.

10 Claims, 20 Drawing Sheets

MEMORY DEVICE AND METHOD OF MANUFACTURING THE SAME

CROSS-REFERENCE TO RELATED APPLICATIONS

This application is based upon and claims the benefit of priority from Japanese Patent Application No. 2022-142460, filed Sep. 7, 2022, the entire contents of which are incorporated herein by reference.

FIELD

Embodiments described herein relate generally to a memory device and a method of manufacturing the same.

BACKGROUND

A memory device which stores data using elements having a dynamic variable resistance is known. Such a memory device is required to store and read data correctly.

Each of FIGS. 5 to 9 shows a state of the memory device according to the first embodiment in the course of a manufacturing process.

Figure 10:
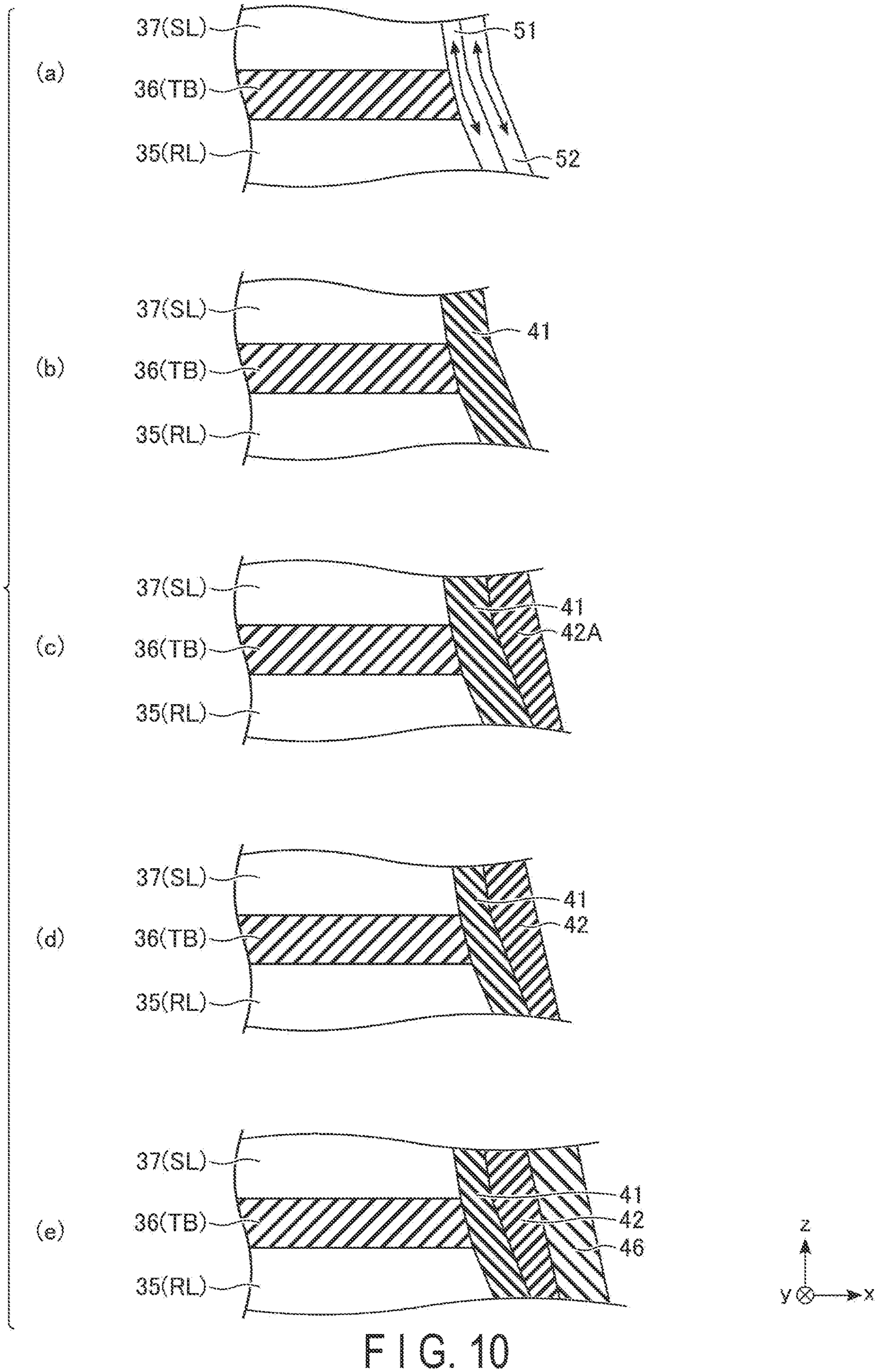

FIG. 10 shows enlarged states of the memory device according to the first embodiment in the course of a manufacturing process.

Figure 11:
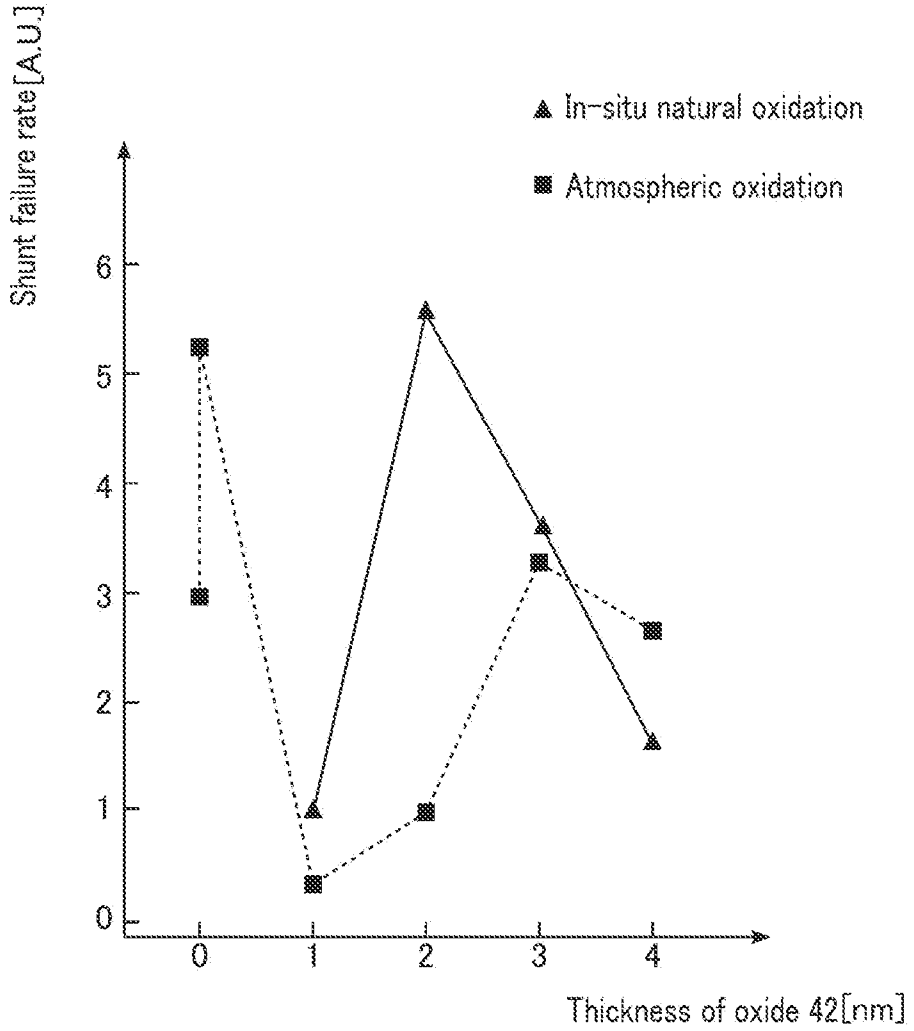

FIG. 11 shows a relationship between a thickness of an oxide and a shunt failure rate according to the first embodiment.

Figure 12:
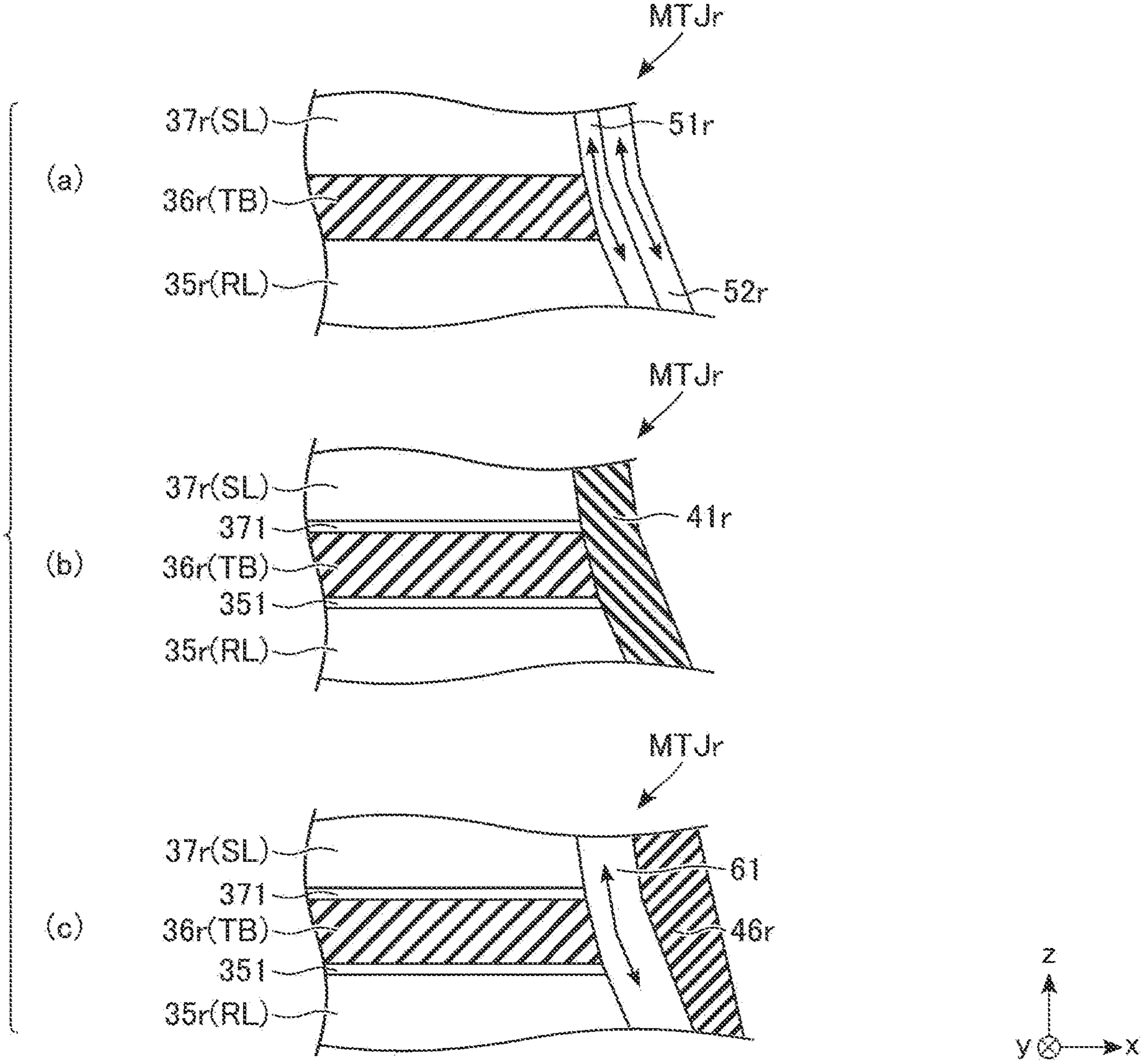

FIG. 12 shows a state of a part of a referential memory device in the course of a manufacturing process.

Figure 13:
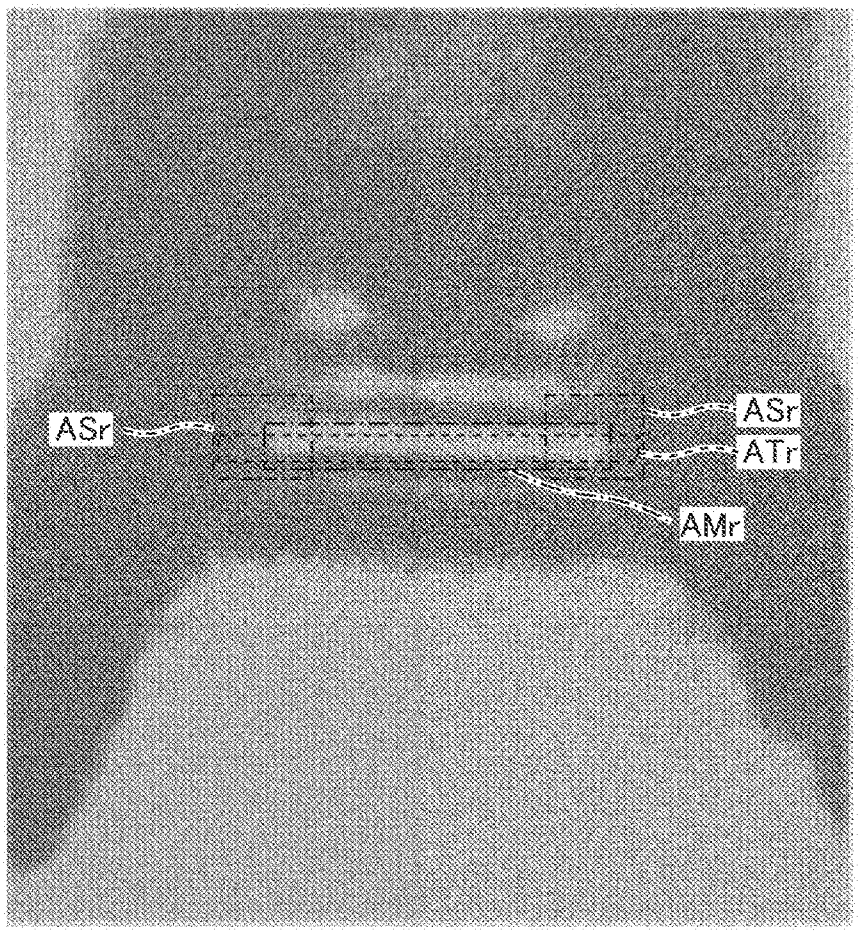

FIG. 13 shows a distribution of oxygen atoms in a referential MTJ element.

Figure 14:
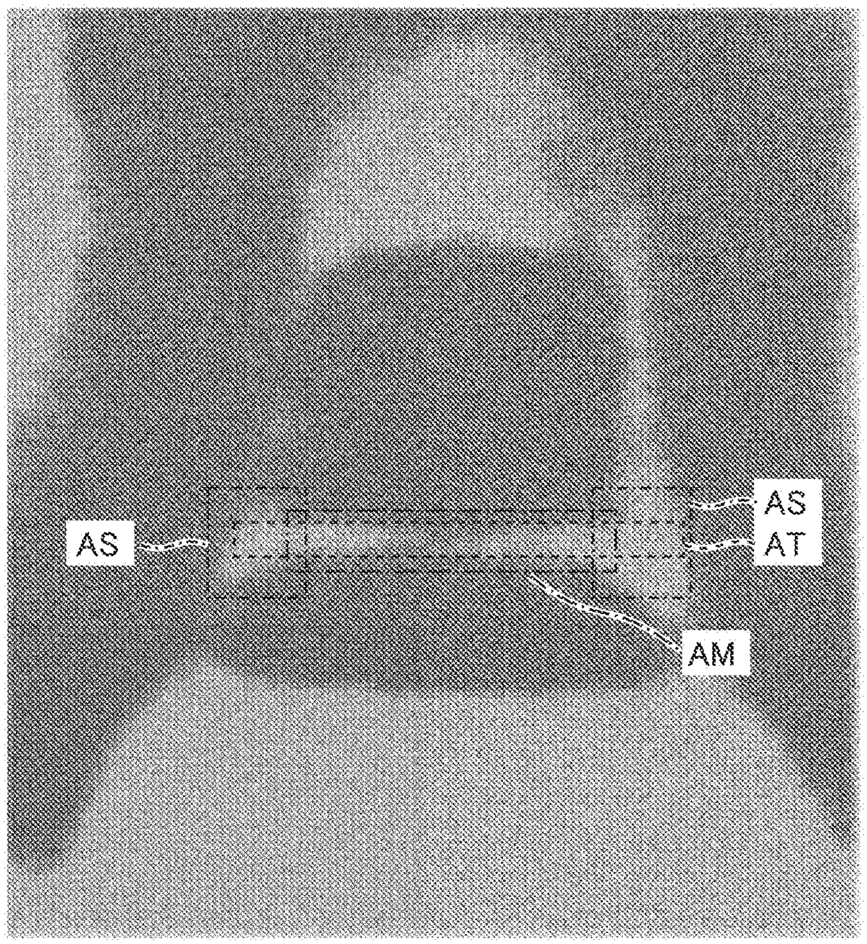

FIG. 14 shows a distribution of oxygen atoms in an MTJ element according to the first embodiment.

Figure 15:
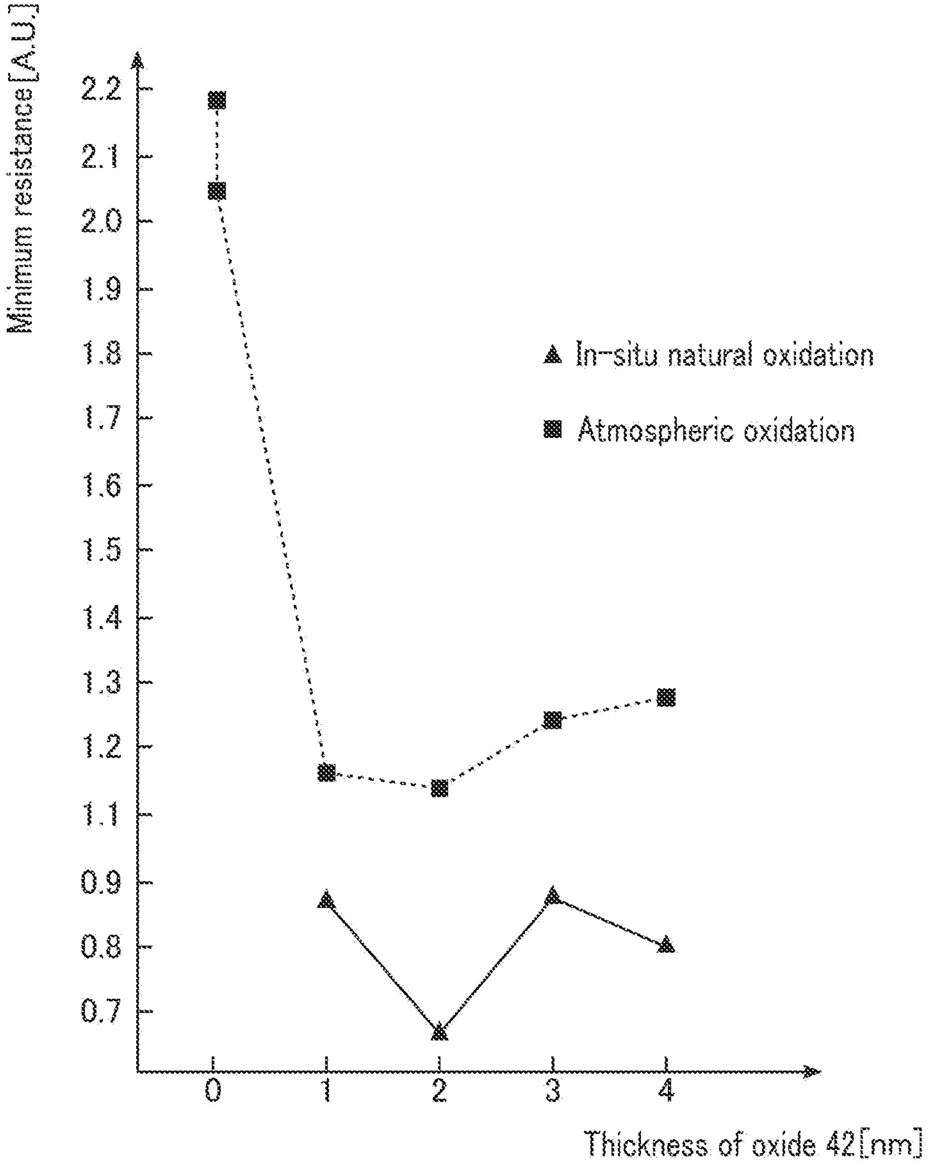

FIG. 15 shows a relationship between a thickness of the oxide and a minimum resistance of the MTJ element according to the first embodiment.

Figure 16:
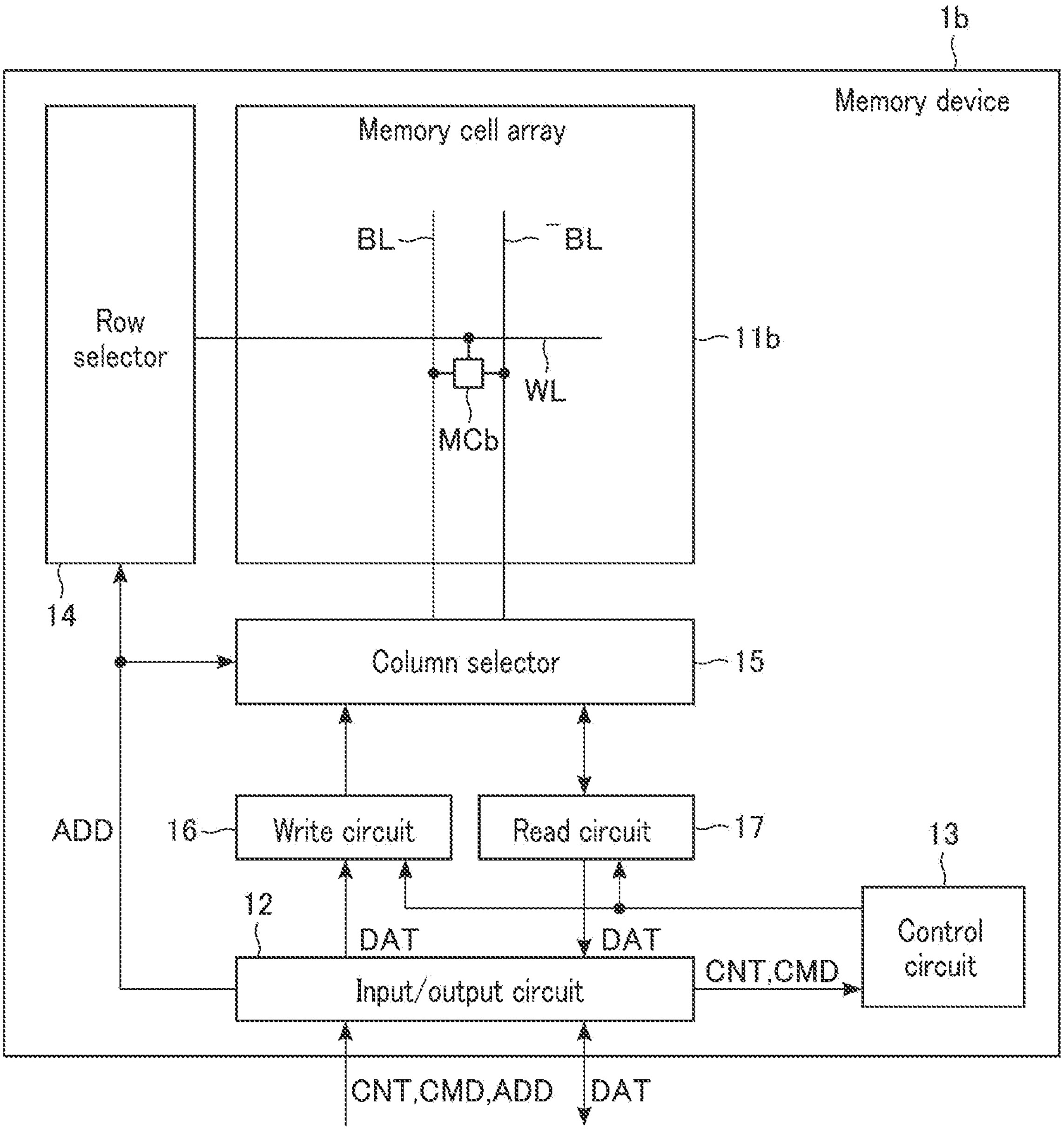

FIG. 16 shows functional blocks of a memory device according to a first modification of the first embodiment.

Figure 17:
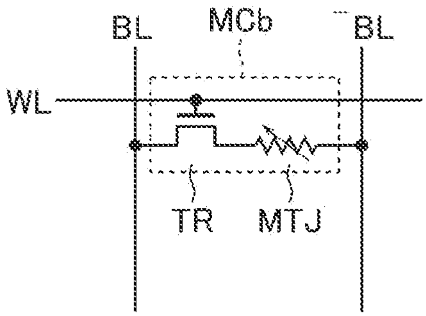

FIG. 17 shows a circuit configuration of a memory cell according to the first modification of the first embodiment.

Figure 18:
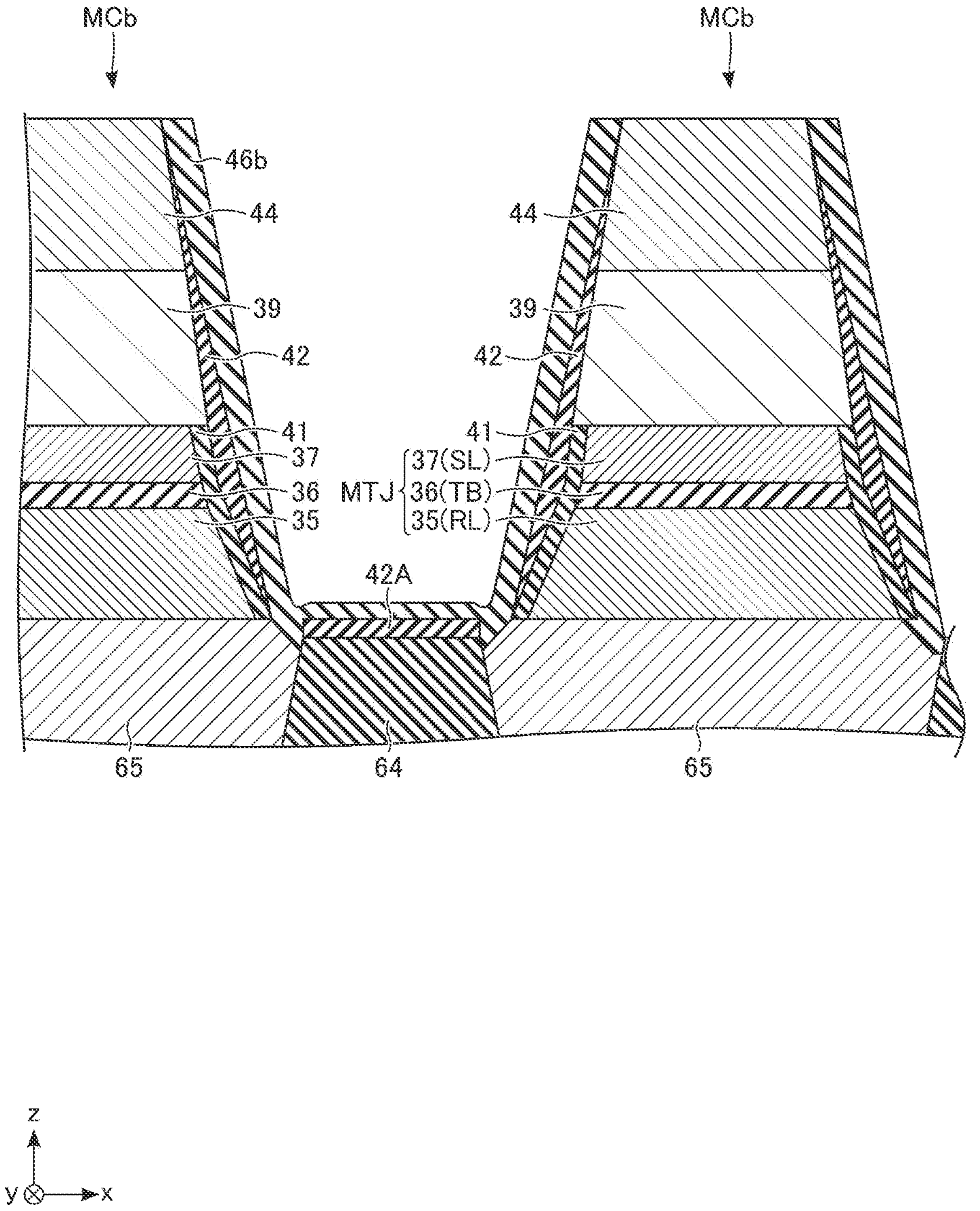

FIG. 18 shows a cross section of an example structure of the memory cell according to the first modification of the first embodiment.

Figure 19:
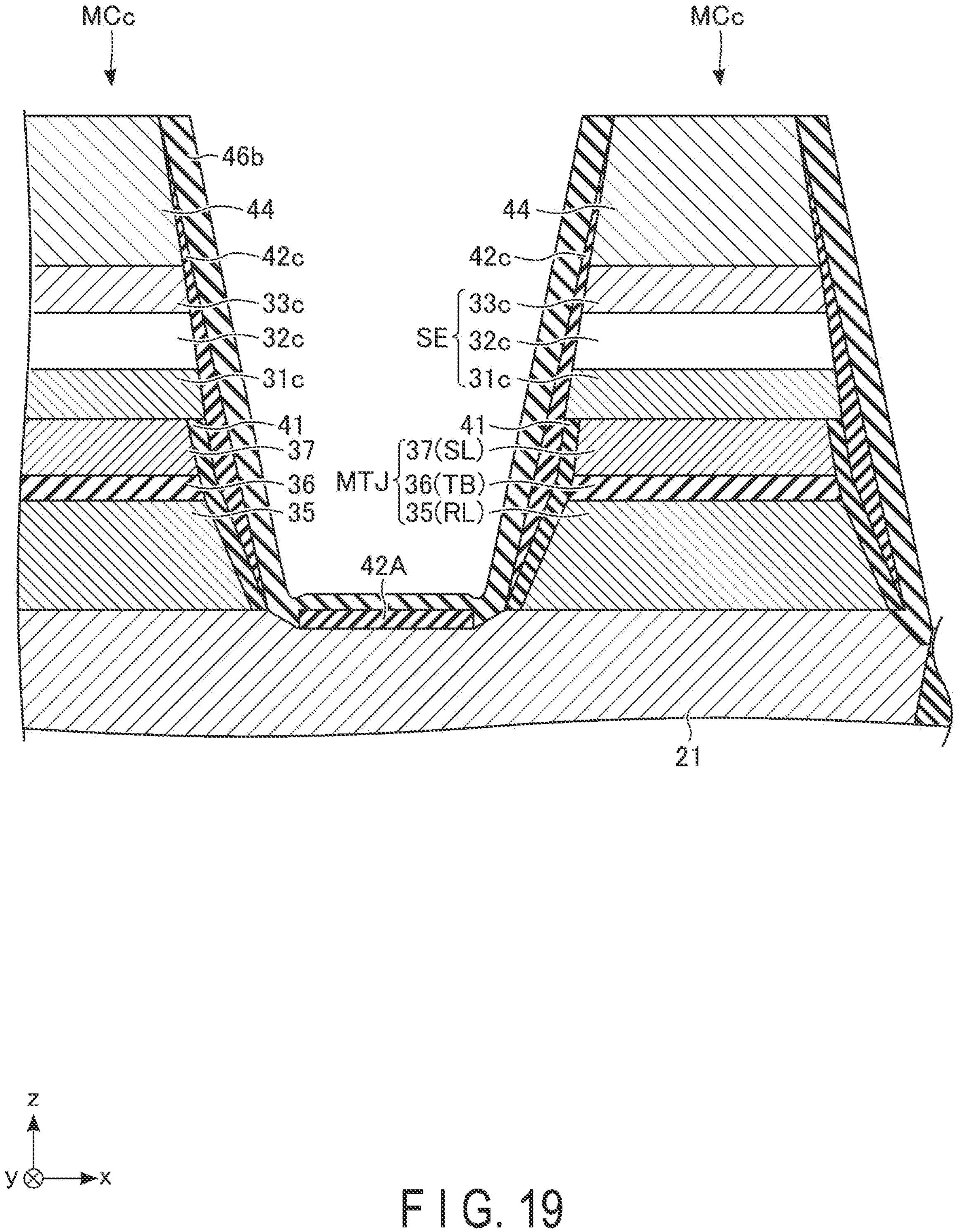

FIG. 19 shows a cross section of an example structure of a memory cell MC according to a second modification of the first embodiment.

Figure 20:
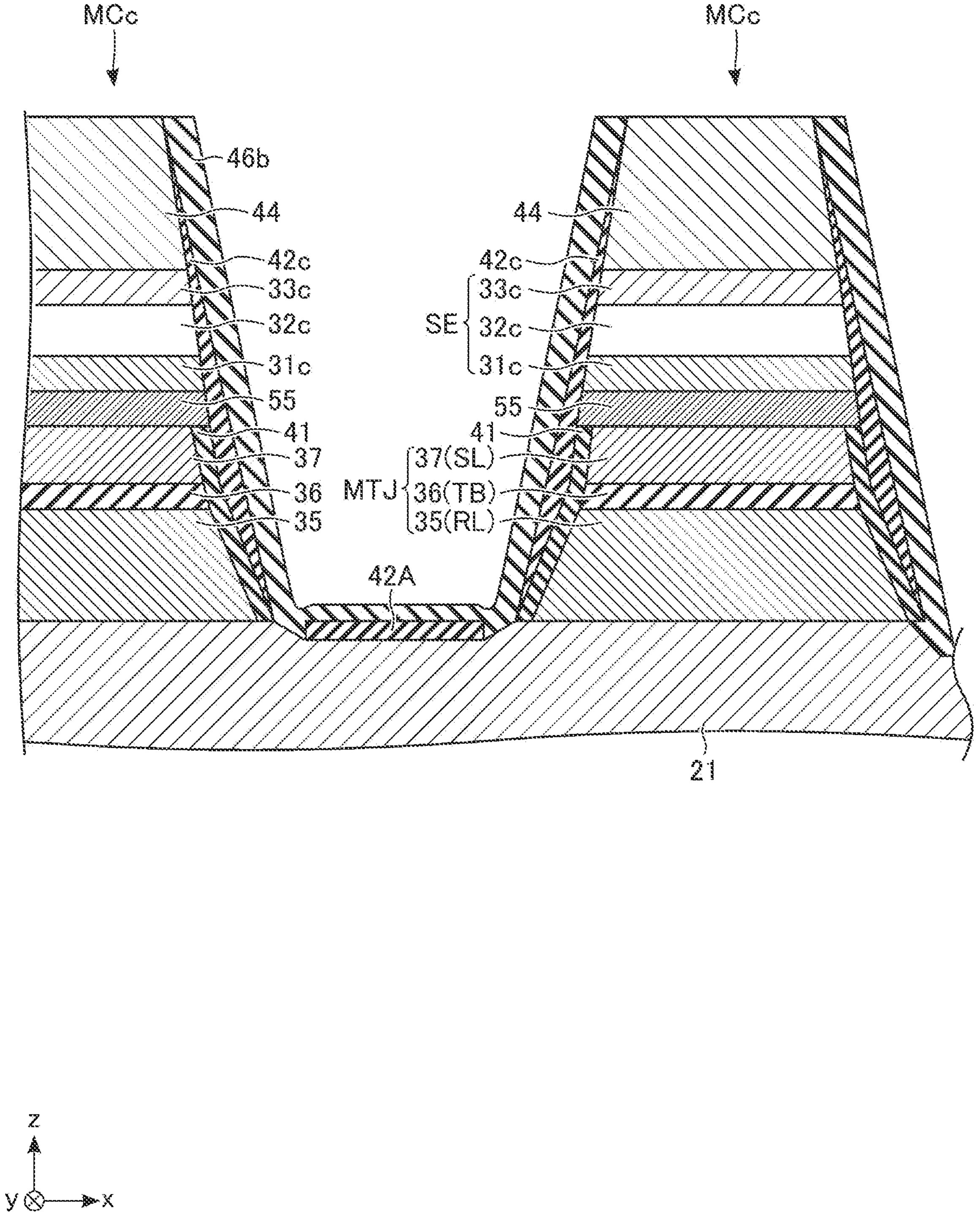

FIG. 20 shows a cross section of an example structure of the memory cell according to the second modification of the first embodiment.

DETAILED DESCRIPTION

In general, according to one embodiment, a memory device includes a first ferromagnetic layer; a second ferromagnetic layer; a first insulating layer between the first ferromagnetic layer and the second ferromagnetic layer; a first oxide; a second oxide; and a silicon nitride. The first oxide is over a side surface of the first ferromagnetic layer, a side surface of the first insulating layer, and a side surface of the second ferromagnetic layer. The second oxide is over the first oxide, and includes a magnesium oxide, an aluminum oxide, a silicon oxide, or an alkaline-earth metal oxide. The silicon nitride is over a side surface of the second oxide.

Embodiments will now be described with reference to the figures. In order to distinguish components having substantially the same function and configuration in an embodiment or over different embodiments from each other, an additional numeral or letter may be added to the end of each reference numeral or letter. For an embodiment subsequent to an embodiment that has already been described, the description will concentrate mainly on the matters that constitute a difference from the already described embodiment. The entire description of a particular embodiment applies to another embodiment unless an explicit mention is made otherwise, or an obvious elimination is involved.

The figures are schematic, and the relation between the thickness and the area of a plane of a layer and the ratio of thicknesses of layers may differ from those in actuality. The figures may include components which differ in relations and/or ratios of dimensions in different figures.

The specification and the claims, when mentioning that a particular (first) component is "coupled" to another (second) component, intend to cover both the form of the first component directly coupled to the second component and the form of the first component coupled to the second component via one or more components which are always or selectively conductive.

The embodiments will be described using an x-y-z orthogonal coordinate system. In the description below, the term "below" as well as the terms derived therefrom and related thereto refer to a position having a smaller coordinate on the z-axis, and "above" as well as the terms derived therefrom and the terms related thereto refer to a position having a larger coordinate on the z-axis.

1. First Embodiment

1.1. Structure (Configuration)

1.1.1. Overall Structure

Figure 1:
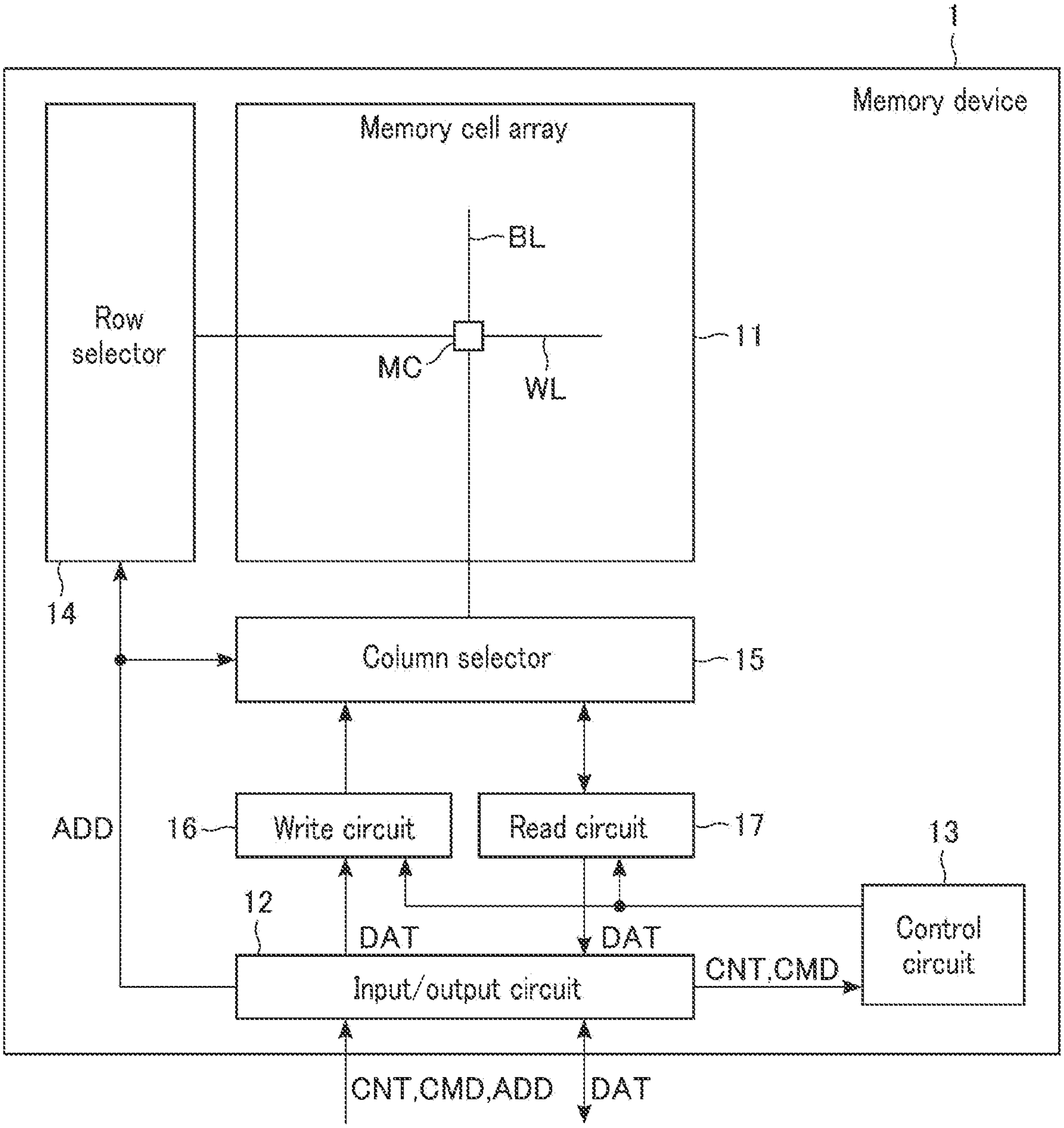
FIG. 1 shows functional blocks of a memory device according to a first embodiment.

FIG. 1 shows functional blocks of a memory device according to a first embodiment. The memory device is a device that stores data. The memory device stores data using a layer stack including ferromagnets showing a variable resistance. As shown in FIG. 1, the memory device 1 includes a memory cell array 11, an input/output circuit 12, a control circuit 13, a row selector 14, a column selector 15, a write circuit 16, and a read circuit 17.

The memory cell array 11 is a set of a plurality of arrayed memory cells MC. The memory cells MC can store data in a non-volatile manner. In the memory cell array 11, word lines WL and bit lines BL are located. Each memory cell MC is coupled to a single word line WL and a single bit line BL. Each word line WL is associated with a row. Each bit line BL is associated with a column. Selection of a single row and selection of a single column selects a single memory cell MC.

The input/output circuit 12 is a circuit which performs input and output of data and signals. The input/output circuit 12 receives, from outside the memory device 1, e.g., a memory controller, a control signal CNT, a command CMD, an address information ADD, and data DAT. The input/output circuit 12 outputs data DAT. The data DAT is data to be written in the case of data write in the memory device 1. The data DAT is read data in the case of data read from the memory device 1.

The control circuit 13 is a circuit that controls the operation of the memory device 1. The control circuit 13 receives the control signal CNT and the command CMD from the input/output circuit 12. The control circuit 13 controls the write circuit 16 and the read circuit 17 based on a control instructed by the control signal CNT and the command CMD. Specifically, the control circuit 13 supplies voltages used for data write to the write circuit 16 during the writing of data to the memory cell array 11. Further, the control circuit 13 supplies voltages used for data read to the read circuit 17 during the reading of data from the memory cell array 11.

The row selector 14 is a circuit that selects a row of a memory cell MC. The row selector 14 receives the address information ADD from the input/output circuit 12, and brings a single word line WL associated with the row specified by the received address information ADD into a selected state.

The column selector 15 is a circuit that selects a column of a memory cell MC. The column selector 15 receives the address information ADD from the input/output circuit 12, and brings one or more bit lines BL associated with the column specified by the received address information ADD into a selected state.

The write circuit 16 receives write data DAT from the input/output circuit 12 and supplies the voltages for data write to the column selector 15 based on the control by the control circuit 13 and the write data DAT.

The read circuit 17 uses the voltages used for data read based on the control of the control circuit 13, to determine data stored in the memory cells MC. The determined data is supplied to the input/output circuit 12 as the read data DAT. The read circuit 17 includes a sense amplifier.

1.1.2. Circuit Configuration of Memory Cell Array

Figure 2:
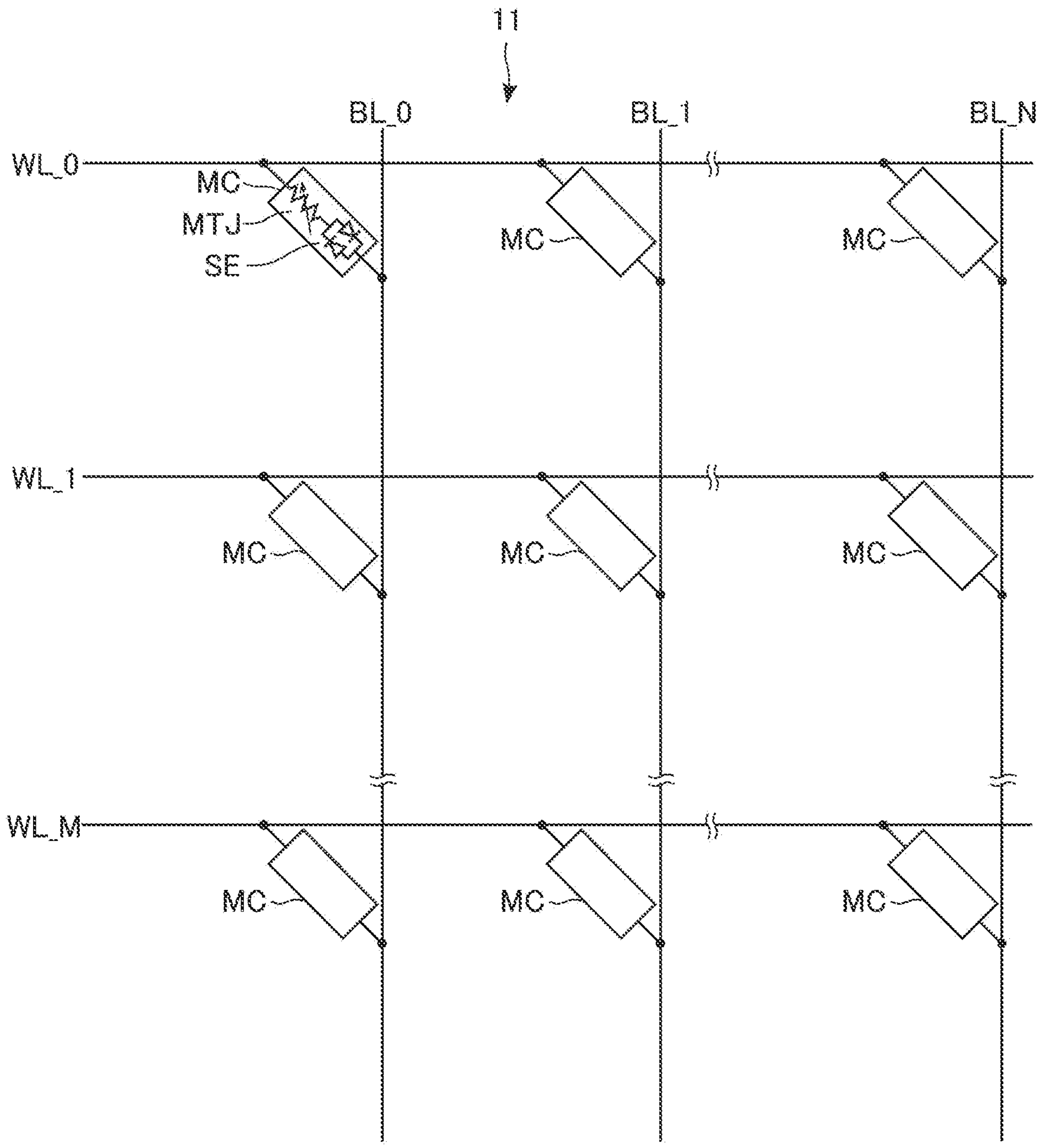
FIG. 2 is a circuit diagram of a memory cell array according to the first embodiment.

FIG. 2 is a circuit diagram of the memory cell array 11 of the first embodiment. As shown in FIG. 2, in the memory cell array 11, M+1 word lines WL (WL_0, WL_1, . . . , WL_M) and N+1 bit lines BL (BL_0, BL_1, . . . , BL_N) are located, where M is a natural number and N is a natural number.

Each memory cell MC is coupled to a single word line WL and a single bit line BL. Each memory cell MC includes a single MTJ element MTJ and a single switching element SE. In each memory cell MC, the MTJ element MTJ and switching element SE are coupled in series. The switching element SE of each memory cell MC is coupled to a single bit line BL. The MTJ element MTJ of each memory cell MC is coupled to a single word line WL.

The MTJ element MTJ shows a tunnel magnetoresistance effect and includes, for example, a magnetic tunnel junction (MTJ). The MTJ element MTJ is a variable resistance element that can switch between a low-resistance state and a high-resistance state. The MTJ element MTJ can store one-bit data using a difference between the two resistance states. For example, the MTJ element MTJ stores “0” data in the low-resistance state and “1” data in the high-resistance state.

The switching element SE electrically couples or decouples its both terminals to or from each other. The switching element SE has two terminals. When a voltage applied between the two terminals is lower than a first threshold, the switching element SE is in a high-resistance state, such as an electrically non-conductive state (or, off state). When the voltage applied between the two terminals rises to the first threshold or higher, the switching element SE is brought into a low-resistance state, such as an electrically conductive state (or, on state). When the voltage applied between the two terminals of the switching element SE in the low-resistance state falls to a second threshold or lower, the switching element SE is brought into a high-resistance state. The switching element SE has a function of switching between the high-resistance and low-resistance states based on the magnitude of the voltage applied in such a first direction, and also has the same function in a second direction opposite to the first direction. That is, the switching element SE is a bidirectional switching element. Turning on or off the switching element SE makes it possible to control whether or not a current is supplied to the MTJ element MTJ coupled to the switching element SE, that is, whether or not the MTJ element MTJ is selected.

1.1.3. Structure of Memory Cell Array

Figure 3:
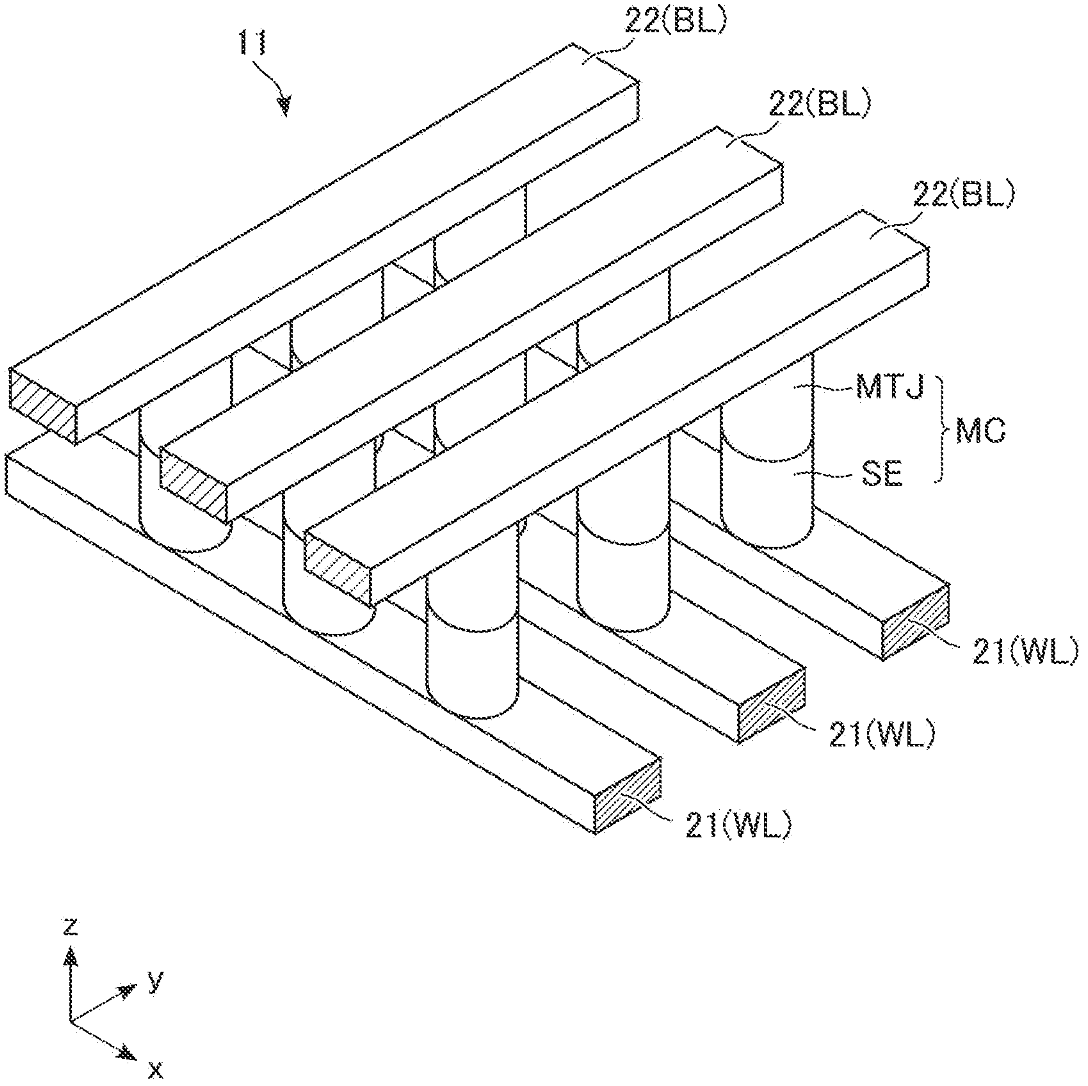
FIG. 3 is a perspective view of a part of a memory cell array according to the first embodiment.

FIG. 3 is a perspective view of a part of the memory cell array 11 according to the first embodiment. As shown in FIG. 3, a plurality of conductors 21 and 22 are provided.

The conductors 21 extend along the x-axis and are arranged along the y-axis. Each conductor 21 serves as a single word line WL.

The conductors 22 are located above the conductors 21. The conductors 22 extend along the y-axis and are arranged along the x-axis. Each conductor 22 functions as a single bit line BL.

A single memory cell MC is provided at each of the intersections between the conductors 21 and 22. The memory cells MC are arranged in a matrix pattern over the xy-plane. Each memory cell MC includes a structure serving as the switching element SE and a structure serving as the MTJ element MTJ. The structure serving as the switching element SE and the structure serving as the MTJ element MTJ each include one or more layers. In one example, the structure serving as the MTJ element MTJ is located on the top face of the structure serving as the switching element SE. The memory cell MC at its bottom face contacts the top face of a single conductor 21. The top face of the memory cell MC contacts the bottom face of a single conductor 22.

1.1.4. Memory Cell

Figure 4:
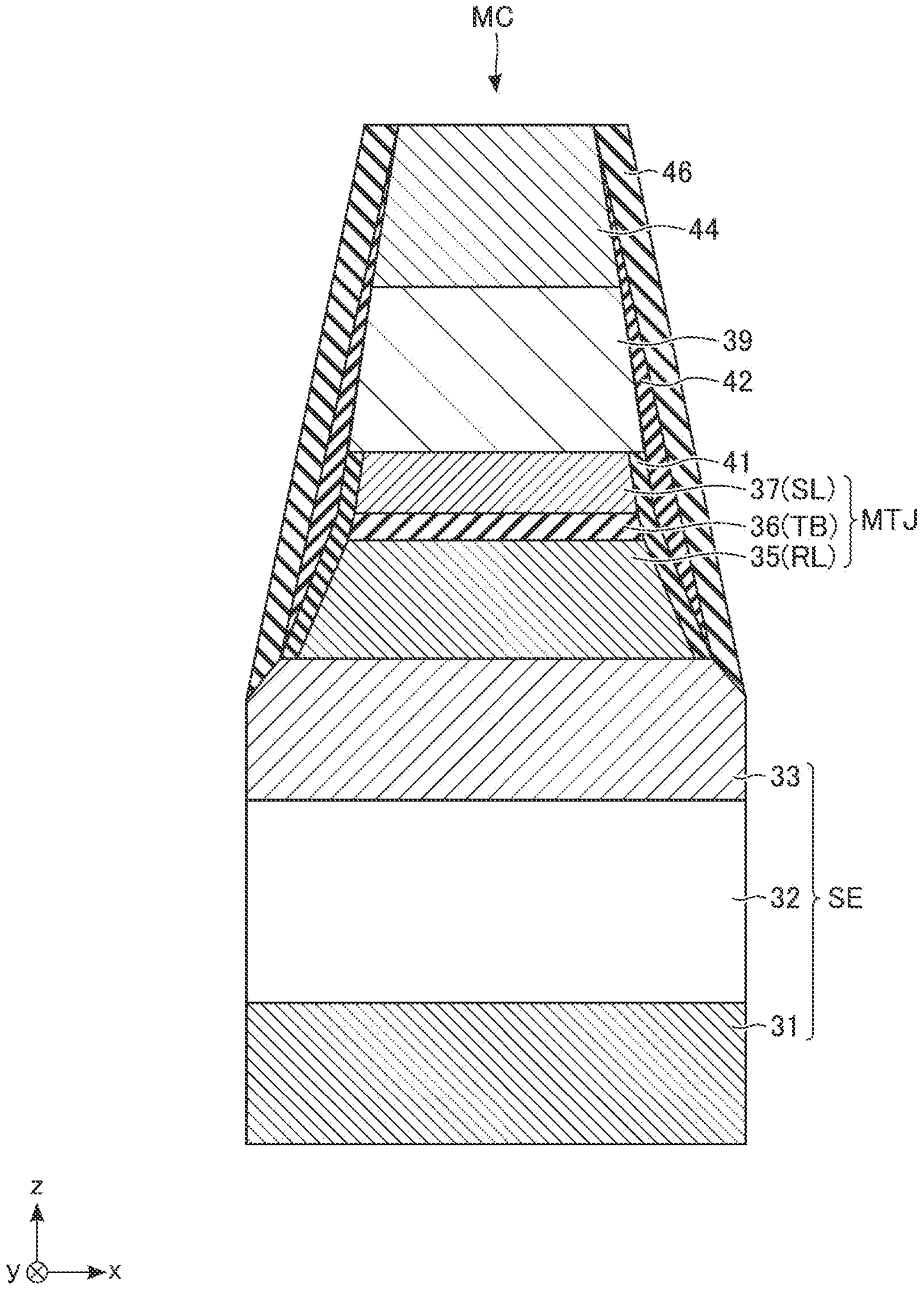
FIG. 4 shows a cross section of an example structure of the memory cell according to the first embodiment.

FIG. 4 shows a cross section of an example of a structure of a memory cell of the first embodiment. The memory cell MC includes the MTJ element MTJ and the switching element SE as described above with reference to FIG. 3, and further includes a cap layer 39, an oxide 41, an oxide 42, a conductor 44, and a silicon nitride 46.

The switching element SE includes a variable resistance material 32. The variable resistance material 32 is a material showing a dynamically variable resistance, and has a form of a layer in one example. The variable resistance material 32 is a switching element between two terminals, namely, a first terminal constituted by one of the top face and the bottom face of the variable resistance material 32 and a second terminal constituted by the other one of the top face and the bottom face of the variable resistance material 32. While a voltage being applied between the two terminals is lower than a first threshold, the variable resistance material 32 is in a high resistance state, for example, an electrically non-conductive state. When the voltage applied between the two terminals is increased to the first threshold or higher, the variable resistance material 32 turns to a low resistance state, for example, an electrically conductive state. When the voltage applied between the two terminals of the low resistance state variable resistance material 32 is decreased to a second threshold or lower, the variable resistance material 32 turns to the high resistance state.

The variable resistance material 32 includes an insulator and a dopant introduced into the insulator by ion injection. The insulator includes, for example, an oxide, which may be $SiO_2$, or a material consisting substantially of $SiO_2$. Examples of the dopant include arsenic (As) and germanium (Ge). The description herein and the accompanying claims, a phrase "consisting (or formed) substantially of" or similar phrases with an expression "substantially" or the like shall be taken to mean that an inclusion of unintended impurities in a component resulting from "consisting substantially of" is tolerated.

The switching element SE may further include a lower electrode 31 and an upper electrode 33. FIG. 4 shows such an example. The variable resistance material 32 is located on the top face of the lower electrode 31, and the upper electrode 33 is located on the top face of the variable resistance material 32. The lower electrode 31 and the upper electrode 33 include or consists substantially of titanium nitride (TiN).

The ferromagnetic layer 35 is a layer of a material showing a ferromagnetic property. The ferromagnetic layer 35 is located on the top face of the switching element SE. For example, the ferromagnetic layer 35 includes cobalt iron boron (CoFeB) or boride iron (FeB), and includes a layer of cobalt iron boron or boride iron (FeB). The ferromagnetic layer 35 may include a plurality of layers. Examples of such layers include a layer of metal and layer of conductor. Examples of the metal include platinum (Pt) and ruthenium (Ru).

The ferromagnetic layer 35 has an easy magnetization axis along the direction penetrating through the interfaces of the ferromagnetic layer 35, the insulating layer 36, and the ferromagnetic layer 37. The easy magnetization axis forms, for example, an angle of 45° or greater and 90° or smaller with respect to each interface, and in one example, it extends along the direction orthogonal to the interfaces. The magnetization direction of the ferromagnetic layer 35 is intended to be unchanged by the data read and write of the memory cell MC. The ferromagnetic layer 35 can serve as a so-called reference layer. The ferromagnetic layer 35 may be hereinafter referred to as a reference layer 35. In one example, the ferromagnetic layer has a shape of a truncated cone.

The insulating layer 36 is a layer of an insulator. The insulating layer 36 is located on the top face of the ferromagnetic layer 35. For example, the insulating layer 36 includes magnesium oxide (MgO) or is formed substantially of magnesium oxide, and serves as a so-called tunnel barrier (TB). The insulating layer 36 may be hereinafter referred to as a tunnel barrier layer 36. In one example, the insulating layer 36 has a shape of a truncated cone.

The ferromagnetic layer 37 is a layer of a material showing a ferromagnetic property. For example, the ferromagnetic layer 37 includes cobalt iron boron (CoFeB) or boride iron (FeB), or consists substantially of CoFeB or FeB. The ferromagnetic layer 37 has an easy magnetization axis along the direction penetrating through the interfaces of the ferromagnetic layer 35, the insulating layer 36, and the ferromagnetic layer 37. The easy magnetization axis forms, for example, an angle of 45° or greater and 90° or smaller with respect to each interface, and in one example, it extends along the direction orthogonal to the interfaces. The magnetization direction of the ferromagnetic layer 37 is variable according to the writing of data in the memory cell MC, and the ferromagnetic layer 37 can serve as a so-called storage layer (SL). The ferromagnetic layer 37 may be hereinafter referred to as a storage layer 37. In one example, the ferromagnetic layer 37 has the shape of a truncated cone.

When the magnetization direction of the storage layer 37 is parallel to the magnetization direction of the reference layer 35, the MTJ element MTJ has a given low resistance. When the magnetization direction of the storage layer 37 is anti-parallel to the magnetization direction of the reference layer 35, the MTJ element MTJ has a resistance higher than the resistance when the magnetization direction of the storage layer 37 and the magnetization direction of the reference layer 35 are parallel to each other.

In response to a write current Iwp of a given magnitude flowing from the storage layer 37 to the reference layer 35, the magnetization direction of the storage layer 37 turns parallel to the magnetization direction of the reference layer 35. In response to a write current Iwap of another given magnitude flowing from the reference layer 35 to the storage layer 37, the magnetization direction of the storage layer 37 turns anti-parallel to the magnetization direction of the reference layer 35.

The oxide 41 is positioned on a side surface of the reference layer 35, a side surface of the tunnel barrier layer 36, and a side surface of the storage layer 37. The oxide 41 extends over the side surface of the reference layer 35, the side surface of the tunnel barrier layer 36, and the side surface of the storage layer 37. The oxide 41 covers at least a side surface of the tunnel barrier layer 36, and covers, of a side surface of the MTJ element MTJ, a portion including an interface between the tunnel barrier layer 36 and the reference layer 35, and a portion including an interface between the tunnel barrier layer 36 and the storage layer 37. The oxide 41 covers, for example, an entire side surface of the reference layer 35, an entire side surface of the tunnel barrier layer 36, and an entire side surface of the storage layer 37.

The oxide 41 includes or consists substantially of an oxide of an element included in the reference layer 35 and/or an oxide of an element included in the storage layer 37. The oxide 41 may further include an oxide of an element included in the upper electrode 33.

The cap layer 39 is positioned on an upper surface of the storage layer 37 and on an upper surface of the oxide 41. The cap layer 39 covers, for example, the upper surfaces of the storage layer 37 and the oxide 41. The cap layer 39 includes a layer including a transition metal and/or a layer of an oxide. Examples of the transition metal include ruthenium (Ru), molybdenum (Mo), and rhodium (Rh). Examples of the oxide include a magnesium oxide, an aluminum oxide, and a gadolinium oxide.

The conductor 44 is positioned on an upper surface of the cap layer 39. The conductor 44 covers, for example, the upper surface of the cap layer 39. The conductor 44 includes or consists substantially of a titanium nitride.

The oxide 42 is positioned on a side surface of the oxide 41 (a surface opposite to the MTJ element). The oxide 42 extends, on the side surface of the oxide 41, from a position at a height of the interface between the tunnel barrier layer 36 and the reference layer 35 to a position at a height of the interface between the tunnel barrier layer 36 and the storage layer 37. The oxide 42 extends, on the side surface of the oxide 41, from a position at a height of the upper surface of the storage layer 37 to a position at a height of a lower surface of the reference layer 35. The oxide 42 covers, for example, an entire side surface of the oxide 41. The oxide 42 may further cover side surfaces of the cap layer 39 and the conductor 44.

The oxide 42 includes or consists substantially of one of the oxides to be described below. As the oxidized element of the oxide 42, an element that is easily oxidized, that is difficult to be nitrided because of the stability of the oxide, and/or that maintains insulating properties even in a nitrided state is used. For the oxide 42, an oxide that has a low rate with respect to the ion beam in first ion beam etching (IBE), to be described below, namely, that has a high resistance to the first IBE and is difficult to be etched by the first IBE, is used. Examples of the oxide include oxides of alkaline-earth metals (calcium (Ca), strontium (Sr), barium (Ba), and radium (Ra)), a magnesium oxide, and an aluminum oxide. Since an alkaline-earth metal, magnesium, and aluminum are easily oxidized, and an alkaline-earth metal oxide, a magnesium oxide, and an aluminum oxide are stable, an alkaline-earth metal, magnesium, and aluminum are difficult to be nitrided. Moreover, an alkaline-earth metal oxide, a magnesium oxide, and an aluminum oxide maintain insulating properties even if part of the oxide is nitrided. Specifically, the oxide 42 includes or consists substantially of one or more alkaline-earth metal oxides such as a calcium oxide, a strontium oxide, a barium oxide, and/or a radium oxide, a magnesium oxide, and/or an aluminum oxide. The oxide 42 may include or consist substantially of a silicon oxide.

The oxide 42 has a thickness of equal to or smaller than 1 nm. The thickness of the oxide 42 will be discussed later.

The silicon nitride 46 is positioned on a side surface (or, surface opposite to the MTJ element) of the oxide 42. The silicon nitride 46 covers, for example, the side surface of the oxide 42.

1.2. Method of Manufacturing

Figure 7:
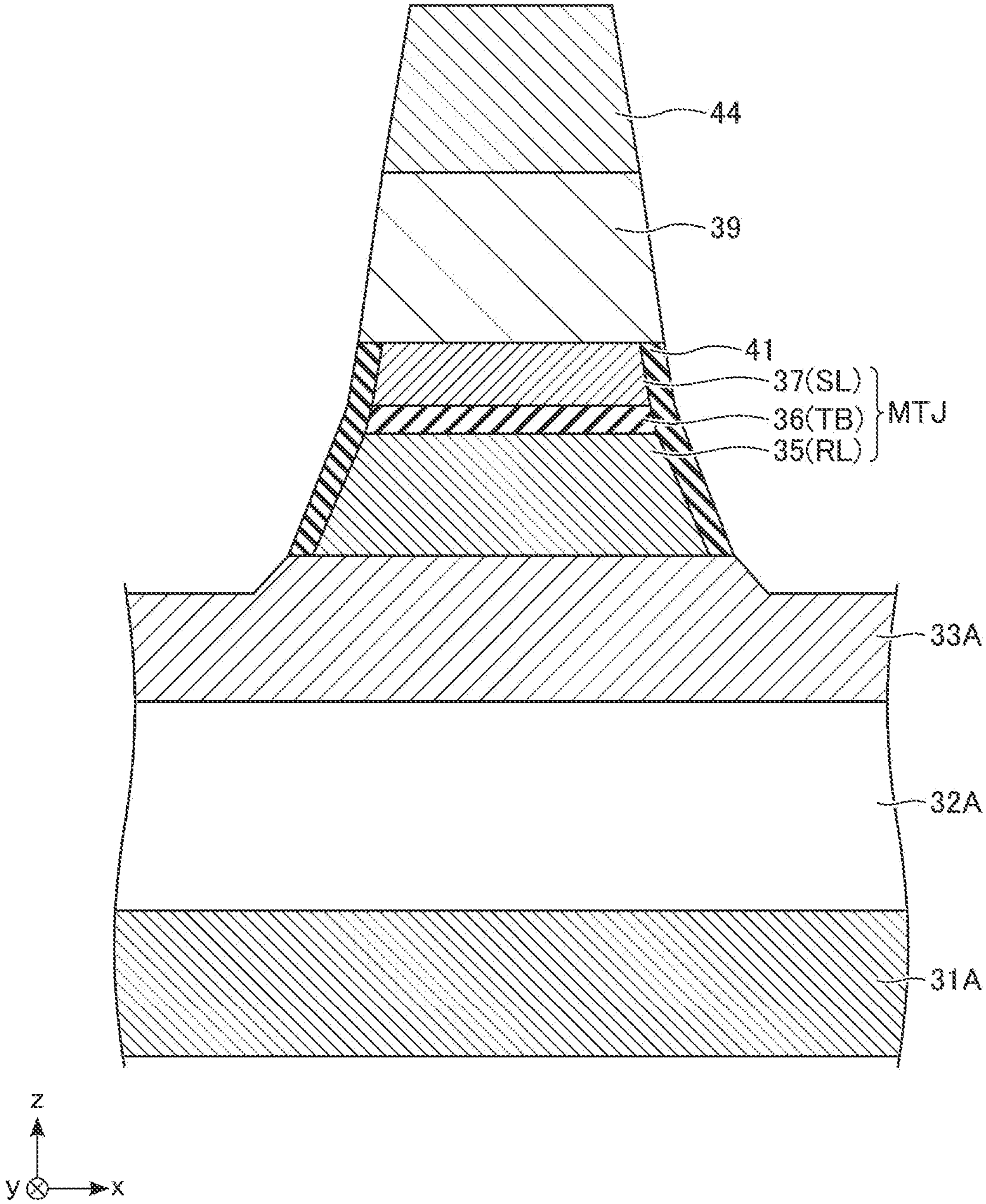
Figure 8:
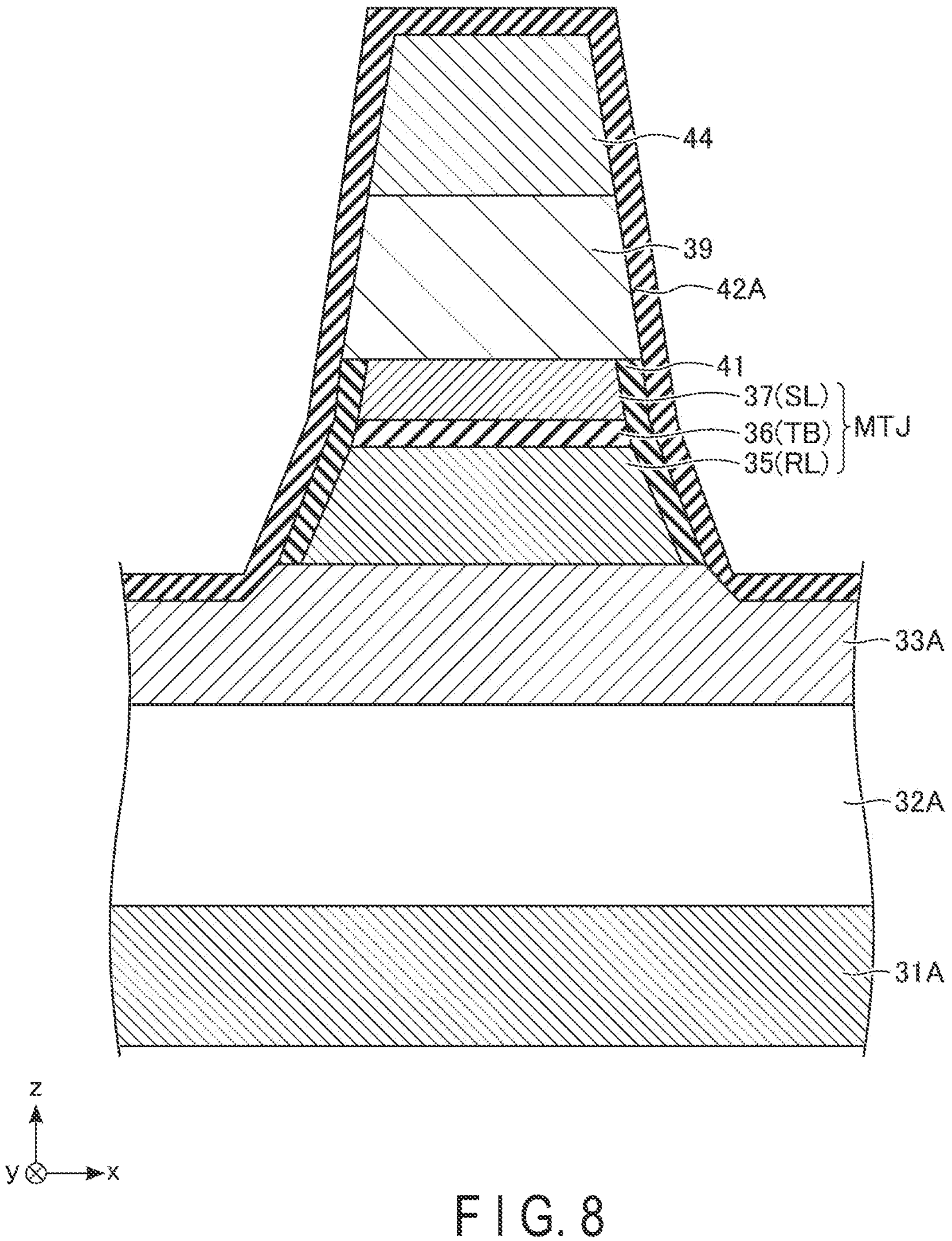
Figure 9:
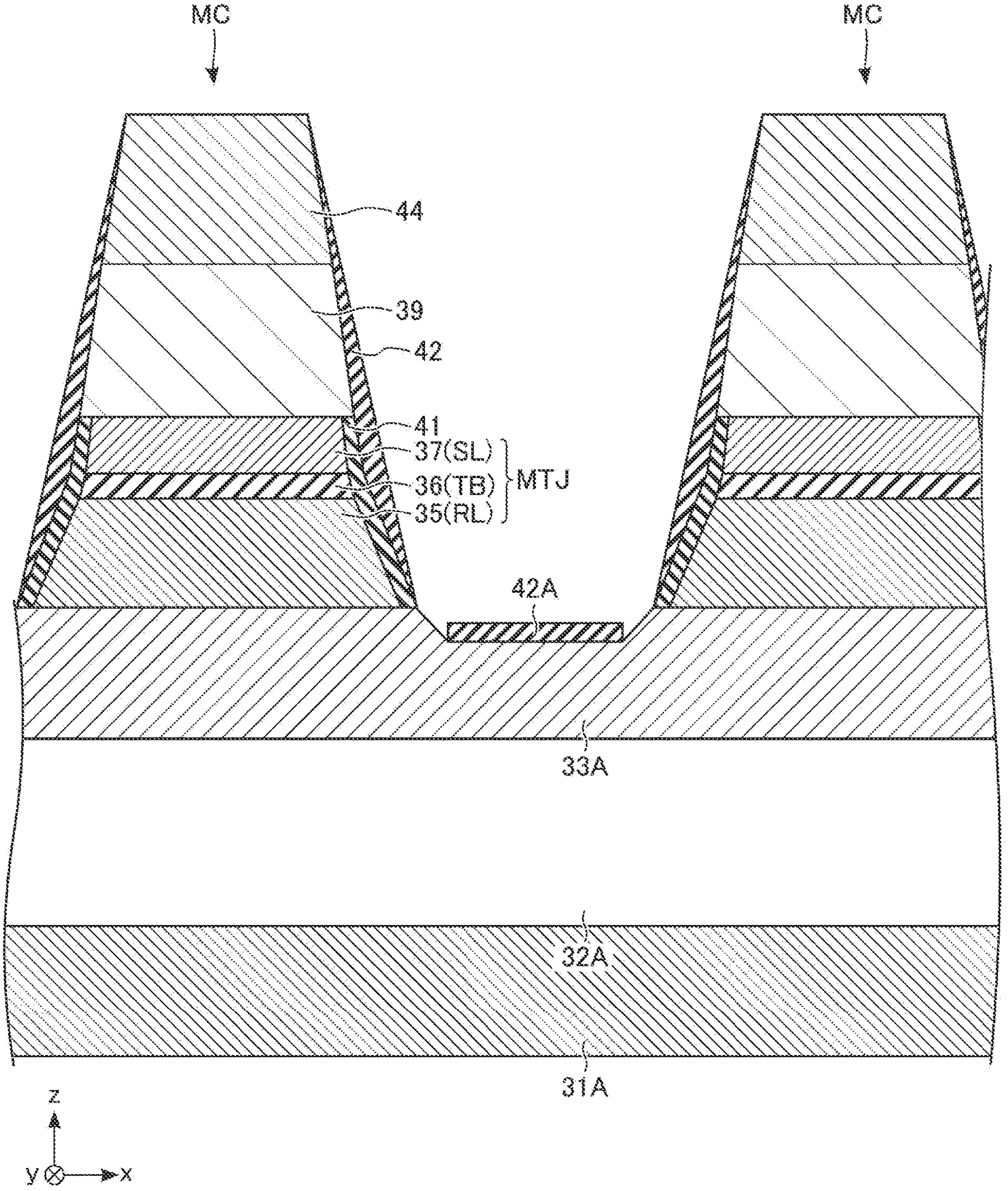

FIGS. 5 to 9 sequentially show states of the memory device according to the first embodiment in the course of a manufacturing process. FIGS. 5 to 8 show the same region as the region shown in FIG. 4. FIG. 9 shows a part of FIG. 4 and a region in the vicinity thereof; specifically, FIG. 9 shows a memory cell MC shown in FIG. 4 and a part of a memory cell MC adjacent thereto.

Figure 5:
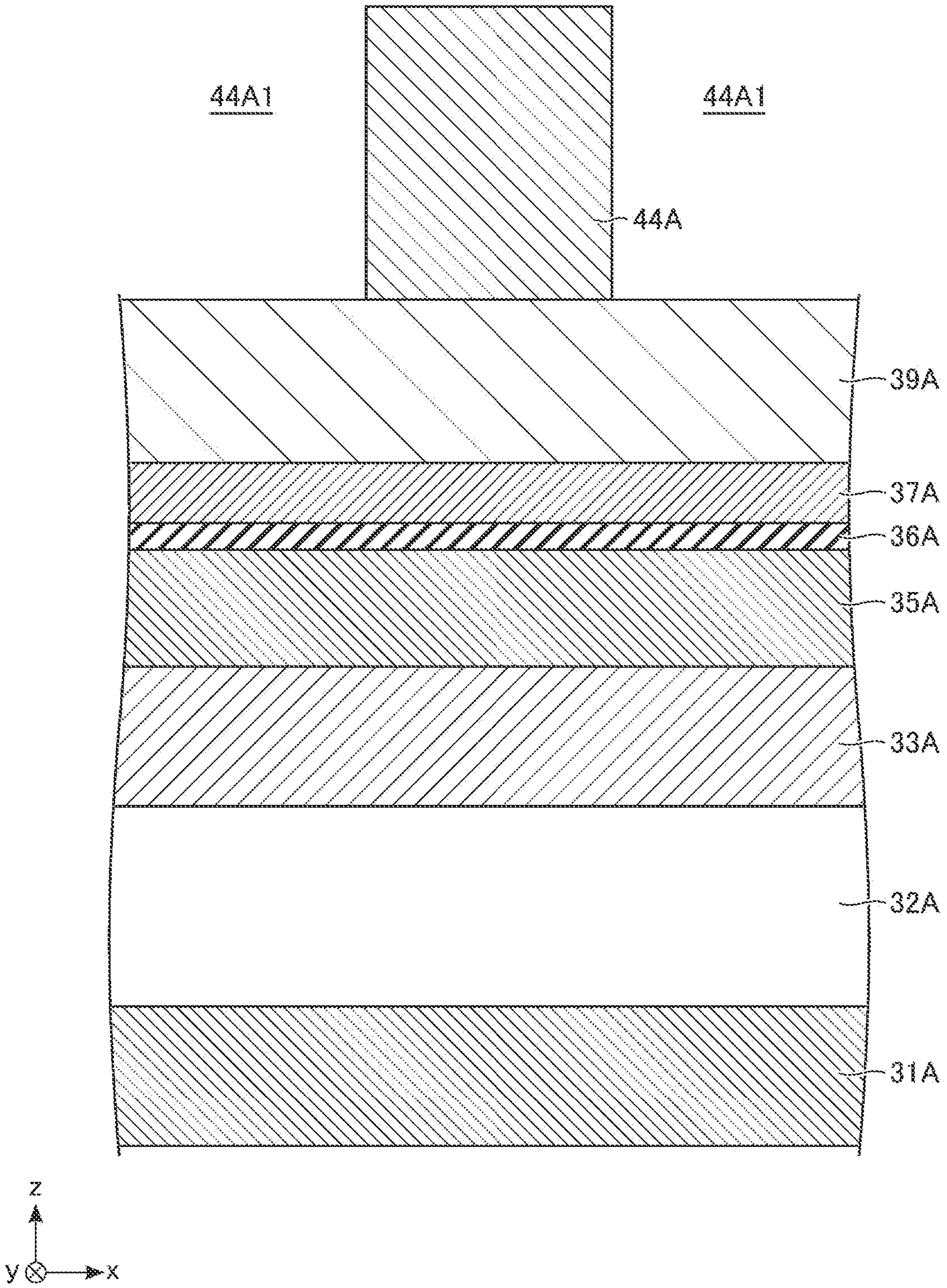

As shown in FIG. 5, a conductor 31A, a variable resistance material 32A, a conductor 33A, a ferromagnet 35A, an insulator 36A, a ferromagnet 37A, a conductor 39A, and a conductor 44A are deposited in this order. The conductor 31A, the variable resistance material 32A, the conductor 33A, the ferromagnet 35A, the insulator 36A, the ferromagnet 37A, the conductor 39A, and the conductor 44A are components that are formed into a lower electrode 31, a variable resistance material 32, an upper electrode 33, a ferromagnetic layer 35, an insulating layer 36, a ferromagnetic layer 37, and a cap layer 39, respectively, in later steps. The conductor 44A is a component that is formed into a conductor 44 in a later step. Examples of a method of the deposition include chemical vapor deposition (CVD) and sputtering.

The conductor 44A remains in a region directly above a region in which the memory cell MC is to be formed, and includes an opening 44A1 in the other region.

Figure 6:
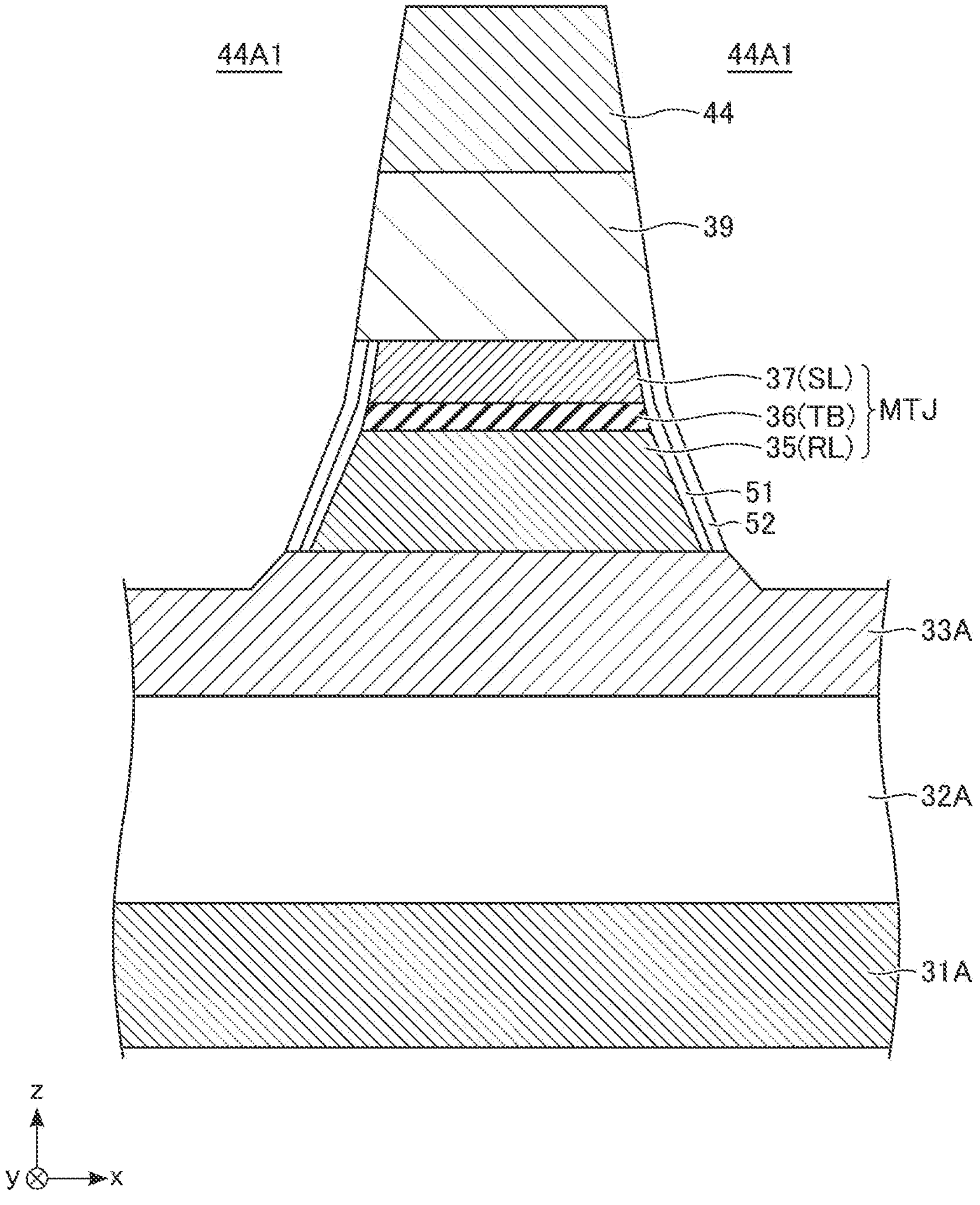

As shown in FIG. 6, the structure obtained by the steps so far is partially removed by IBE. The IBE in FIG. 6 may be referred to as a "first IBE". The first IBE is performed using the conductor 44A as a mask. An ion beam travels through the opening 44A1, and ablates components in the opening 44A1. Through the first IBE, the conductor 39A, the ferromagnet 37A, the insulator 36A, and the ferromagnet 35A are formed into a cap layer 39, a ferromagnetic layer 37, an insulating layer 36, and a ferromagnetic layer 35, respectively. Through the first IBE by which an upper surface of the conductor 44A is lowered and the conductor 44A is partially ablated, the conductor 44A is formed into a conductor 44. A portion of an upper surface of the conductor 33A that is in the opening 44A1 is exposed. The exposed portion of the upper surface of the conductor 33A is ablated by the first IBE, and a top surface of the ablated portion is lowered in position.

IBE can change the state of an object with which an ion beam has collided. Thus, as a result of execution of the first IBE, states of side surfaces of the ferromagnetic layer 37, the insulating layer 36, and the ferromagnetic layer 35 may change. That is, IBE can cause a cascade effect in an object with which the ion beam has collided. Through the cascade effect, atoms on a surface of the object with which the ion beam has collided move to the periphery. Thereby, a mixed region 51 in which atoms included in each of the ferromagnetic layer 37, the insulating layer 36, and the ferromagnetic layer 35 are mixed is formed on the side surfaces of the ferromagnetic layer 37, the insulating layer 36, and the ferromagnetic layer 35. The ferromagnet 35A, the insulator 36A, and the ferromagnet 37A include the atoms listed above with reference to FIG. 4, and some of the atoms included therein are metals. Accordingly, the mixed region 51 has conductivity.

Atoms removed from objects with which an ion beam has collided by IBE are deposited on peripheral objects, and a re-deposition layer 52 is formed. Such atoms include atoms ablated from the conductor 44A, the conductor 39A, the ferromagnet 37A, the insulator 36A, the ferromagnet 35A, and the conductor 33A. The re-deposition layer 52 extends over the side surface of the ferromagnetic layer 37, the side surface of the insulating layer 36, and the side surface of the ferromagnetic layer 35; specifically, the re-deposition layer 52 extends over a surface of the mixed region 51. The ferromagnet 35A, the ferromagnet 37A, the conductor 39A, and the conductor 44A include the atoms listed above with reference to FIG. 4, and some of the atoms included therein are metals. Accordingly, the re-deposition layer 52 has conductivity.

As shown in FIG. 7, the mixed region 51 and the re-deposition layer 52 are oxidized and formed into an oxide 41. It suffices that the oxidation is performed with an intensity that is high enough to oxidize the region 51 and the re-deposition layer 52, and it is not necessary that a portion other than the mixed region 51 and the re-deposition layer 52, for example, a portion of the ferromagnetic layer 37 and/or a part of the ferromagnetic layer 35 be oxidized. The mixed region 51 and the re-deposition layer 52 have very small thicknesses. Thus, the oxidation is performed with a very low intensity. The oxidation can be performed, for example, without going through a special and/or dedicated step for oxidation. Specifically, a method of oxidation includes oxidation (in-situ natural oxidation) using oxides in a chamber of an IBE device that performs the first IBE, and atmospheric oxidation based on exposure to the atmosphere after the first IBE. The intensity of the atmospheric oxidation is higher than that of in-situ natural oxidation. In-situ natural oxidation occurs by letting oxygen flow in an apparatus for performing the steps shown in FIGS. 6 and 8 while maintaining the memory cell MC being manufactured in the device for the period from the start of the step shown in FIG. 6 to the start of the step shown in FIG. 8. Thus, during the period from the start of the step shown in FIG. 6 to the start of the step shown in FIG. 8, to be described later, the memory cell MC being manufactured is not exposed to the atmosphere.

As shown in FIG. 8, an oxide 42A is deposited on the entire structure obtained by the steps so far. The oxide 42A is a component formed into an oxide 42 in a later step. The oxide 42A covers side surfaces of the oxide 41 and the cap layer 39, and an upper surface and a side surface of the conductor 44. Also, the oxide 42A covers a portion of the upper surface of the conductor 33A that is not covered by the ferromagnetic layer 35 and the oxide 41. The oxide 42A has a thickness equivalent to that of the oxide 42.

As shown in FIG. 9, the oxide 42A is partially removed by IBE. The IBE of FIG. 9 may be referred to as "second IBE". Through the second IBE, the oxide 42A is formed into an oxide 42. That is, the second IBE removes a portion of an upper surface of the conductor 44 of each memory cell MC. Also, through the second IBE, a portion of the oxide 42A on a side wall of each memory cell MC is partially reduced in thickness.

The conditions of the second IBE, in particular, the energy and the thickness of the oxide 42 (oxide 42A), relate to one another. The conditions of the second IBE are conditions under which at least the oxide 42 remains as a result of the second IBE. Due to the very small thickness of the oxide 42A, part of the ion beam is considered to pass through the oxide 42A, and to reach the oxide 41. Thus, through the second IBE, the oxide 41 is partially ablated, thereby decreasing the thickness of the oxide 41. The second IBE is performed for the purpose of reducing the thickness of the oxide 41 in this manner. Thus, the second IBE is performed with a lowest level of energy that allows the ion beam to pass through the oxide 42A and to partially remove the oxide 41, based on the thickness of the oxide 42A. On the other hand, if the energy level of the ion beam is too high, the ion beam may also pass through the oxide 41. The ion beam having passed through the oxide 41 may reach the ferromagnetic layer 37, the insulating layer 36, and/or the ferromagnetic layer 35, and may destroy the crystalline structures of the ferromagnetic layer 37, the insulating layer 36, and/or the ferromagnetic layer 35. This leads to deterioration in magnetic properties of the MTJ element MTJ. Accordingly, the second IBE is performed with a highest level of energy that does not allow the ion beam to destroy the crystalline structures of the ferromagnetic layer 37, the insulating layer 36, and the ferromagnetic layer 35 and to make the magnetic properties of the MTJ element MTJ to fall below the required ones.

Also, the second IBE uses an ion beam that travels at an angle of 10° or so relative to an axis vertical to interfaces of the ferromagnetic layer 37, the insulating layer 36, and the ferromagnetic layer 35.

The second IBE is performed using the conditions and the angle described above, and the oxide 42A has a high resistance to the second IBE, namely, has a high hardness. Accordingly, a portion of the oxide 42A on an upper surface of the conductor 33A, namely, a portion between adjacent memory cells MC, is not fully ablated by the second IBE and remains.

After the second IBE described with reference to FIG. 9, a silicon nitride 46 is formed on a surface of the oxide 42 (or, surface opposite to the MTJ element MTJ), as shown in FIG. 4. Subsequently, the oxide 42A is removed through etching, and the conductor 33A, the variable resistance material 32A, and the conductor 31A are respectively formed into the upper electrode 33, the variable resistance material 32, and the lower electrode 31. Examples of the etching include reactive ion etching (RIE) and IBE. Thereby, the structure shown in FIG. 4 is completed.

FIG. 10 shows states of a part of the memory device according to the first embodiment in the course of a manufacturing process. In FIG. 10, enlarged partial views of the states shown in FIGS. 6, 7, 8, 9, and 4 are shown.

As described with reference to FIG. 6 and shown in the portion (a) of FIG. 10, a mixed region 51 and a re-deposition layer 52 are formed by first IBE. At the stage (stage shown in FIG. 6) shown in the portion (a) of FIG. 10 of the manufacturing process, each of the mixed region 51 and the re-deposition layer 52 has conductivity. In FIG. 10, the conductivity of the mixed region 51 and the re-deposition layer 52 is represented by arrows in the mixed region 51 and the re-deposition layer 52.

As described with reference to FIG. 7 and shown in the portion (b) of FIG. 10, the mixed region 51 and the re-deposition layer 52 are oxidized, and thereby an oxide 41 is formed. The portion that was formerly the mixed region 51 and the re-deposition layer 52 loses its conductivity through oxidization.

As described with reference to FIG. 8 and shown in the portion (c) of FIG. 10, an oxide 42A is formed on a surface of the oxide 41.

As described with reference to FIG. 9 and shown in the portion (d) of FIG. 10, the oxide 42A is partially removed by second IBE, and an oxide 42 is formed. A part of an ion beam of the second IBE reaches the oxide 41 via the oxide 42A, and partially removes the oxide 41. As a result, as shown in the portion (d) of FIG. 10, the thickness of the oxide 41 becomes smaller than the thickness prior to the performance of the second IBE.

As described with reference to FIG. 4 and shown in the portion (e) of FIG. 10, a silicon nitride 46 is formed.

1.3. Thickness of Oxide 42

The oxide 42 has a thickness equal to or lower than 1 nm, as will be described below. The thickness is, for example, a distance between a surface of the oxide 42 facing the oxide 41 and a surface of the oxide 42 facing the silicon nitride 46. The thickness of the oxide 42 is, for example, largest among thicknesses of the oxide 42*a* at various positions.

FIG. 11 shows a relationship between a thickness of the oxide 42 and a shunt failure rate according to the first embodiment. A shunt failure refers to a failure that brings the reference layer 35 and the storage layer 37 into conduction by means of a conductive substance on a side surface of the tunnel barrier layer 36. The shunt failure rate refers to a ratio of MTJ elements in which shunt failures are determined to be occurring based on certain conditions to a certain number of MTJ elements. The conditions are based on, for example, resistance values and/or magneto-resistance ratios (MR ratios) of the MTJ elements. That is, it is determined that a shunt failure is occurring in an MTJ element having a resistance value and/or an MR ratio lower by a certain range than a normal distribution of resistance values and/or MR ratios of a plurality of MTJ elements. The MR ratio is a ratio of a resistance of an MTJ element in a high-resistance state to a resistance of the MTJ element in a low-resistance state.

FIG. 11 shows a shunt failure rate on a longitudinal axis in a given unit. FIG. 11 shows two patterns of a method of forming the oxide 42. As described with reference to the manufacturing method, the oxide 42 is formed by oxidizing the conductive substance at the position of the oxide 42. One way to suppress shunt failures is to oxidize the conductive substance strongly. On the other hand, the conductive substance may be oxidized weakly as long as shunt failures can be suppressed. The method of oxidation includes in-situ natural oxidation in an IBE apparatus that performs first IBE and atmospheric oxidation by means of exposure to the atmosphere after the first IBE.

FIG. 11 shows an example in which the oxide 42 is an aluminum oxide.

As is clear from FIG. 11, in any of the patterns, the shunt failure rate is significantly low in the case where the thickness of the oxide 42 is equal to or lower than 1 nm, compared to the case where the thickness is greater than 1 nm. In particular, if in-situ natural oxidation is used, the shunt failure rate at 1 nm significantly decreases. As described above with reference to FIG. 7, the oxidation of the oxide 42 may be weak. If the thickness of the oxide 42 is equal to or lower than 1 nm, a shunt failure rate that is as low as the atmospheric oxidation can be achieved even by very weak oxidation such as in-situ natural oxidation. Accordingly, the oxide 42 has a thickness of equal to or lower than 1 nm.

1.4. Advantages (Effects)

According to the first embodiment, it is possible to provide an MTJ element in which occurrence of a shunt failure is suppressed and which has a suppressed resistance, as will be described below.

Generally, a mixed region and a re-deposition layer, such as the mixed region 51 and the re-deposition layer 52, are inevitably formed by IBE (e.g., the first IBE) for forming a material to be processed into an MTJ element into individual MTJ elements. The mixed region and the redeposition layer, which contain conductive atoms, are made into insulators through oxidation. Such conductive atoms may contain atoms that are resistant to oxidation. In order to oxide atoms that are resistant to oxidation, a mixed region and a redeposition layer are strongly oxidized in a method of manufacturing a referential memory device. Through the strong oxidation, a portion other than the mixed region and the redeposition layer may be oxidized. FIG. 12 shows a state of a part of a referential memory device in the course of a manufacturing process.

FIG. 12 shows an MTJ element MTJr of a referential memory device, in which a region similar to that of FIG. 10 of the first embodiment is shown. The MTJ element MTJr includes a reference layer 35*r*, a tunnel barrier layer 36*r*, and a storage layer 37*r*. The portion (a) of FIG. 12 is similar to the portion (a) in FIG. 10 of the first embodiment, showing that a mixed region 51*r* and a re-deposition layer 52*r* are formed.

As shown in the portion (b) of FIG. 12, the mixed region 51*r* and the re-deposition layer 52*r* are oxidized, similarly to the step in FIG. 7 of the first embodiment. The oxidation is performed strongly, unlike the step in FIG. 7 of the first embodiment. Through the strong oxidation, the mixed region 51*r* and the re-deposition layer 52*r* are converted into an oxide 41*r*, and a portion of the reference layer 35*r* facing the tunnel barrier layer 36*r* and a portion of the storage layer 37*r* facing the tunnel barrier layer 36*r* are inevitably oxidized. As a result, an oxidized region 351 is formed at a portion of the reference layer 35*r* facing the tunnel barrier layer 36*r*, and an oxidized region 371 is formed at a portion of the storage layer 37*r* facing the tunnel barrier layer 36*r*. The oxidized regions 351 and 371 have resistances higher than those in a state in which these regions are not oxidized. Thus, if a write current is supplied to the MTJ element MTJr using a write circuit 16, write currents Iwp and Iwap required for the MTJ element MTJr are not supplied. Thus, if an MTJ element MTJr in the process of manufacturing is strongly oxidized for the purpose of suppressing a shunt failure, write currents Iwp and Iwap of a sufficiently large magnitude will not flow to the MTJ element MTJr, possibly causing a failure of data writing to the MTJ element MTJr. Alternatively, if a write circuit capable of applying a high voltage is used to supply write currents Iwp and Iwap of a sufficiently large magnitude to a high-resistance MTJ element MTJr, the tunnel barrier layer 36 may be destroyed. Accordingly, a higher voltage cannot be applied to the MTJ element MTJr. In this manner, a shunt failure rate and a date writing failure have a trade-off relationship.

As shown in the portion (c) of FIG. 12, a silicon nitride 46*r* is deposited on the oxide 41*r*. Nitrogen in the silicon nitride 46*r* is diffused into the oxide 41*r*. The nitrogen may substitute oxygen atoms in the oxide 41*r*. Thus, a metal such as iron in the oxide 41*r* has insulating properties in an oxidized state, but has conductive properties in a nitrided state. As a result of the oxygen atoms combined with the metal substituting the nitrogen atoms diffused from the silicon nitride 46*r*, the oxide 41*r* may change into the conductor 61. The conductor 61 may increase the shunt failure rate of the MTJ element MTJr.

According to the first embodiment, the oxide 41 is positioned on a side surface of the MTJ element MTJ, an oxide 42 having a thickness equal to or below 1 nm is provided on the oxide 41, and a silicon nitride 46 is provided on the oxide 42. The oxide 42 is an oxide of an element that is easily oxidized, that is difficult to be nitrided because of the stability of the oxidized state, and has insulating properties even after being nitrided. Thus, the oxide 42 is not easily changed into a nitride by nitrogen diffused from the silicon nitride 46 with which the oxide 42 is in contact. It is thus possible to suppress the oxide 42 from becoming a nitride, thereby suppressing reduction in insulating properties and an increase in the shunt failure rate. In addition, since oxidized elements of the oxide 42 have high insulating properties even in a nitrided state, even if a part of the oxide 42 is nitrided, it is possible to keep high insulating properties of the oxide 42, thereby suppressing shunt failures.

In addition, the oxide 41 and the silicon nitride 46 are not in contact because of the oxide 42. Accordingly, nitrogen atoms diffused from the silicon nitride 46 do not easily reach the oxide 41. It is thus possible to suppress a metal oxide in the oxide 41 from changing into a metal nitride, thereby suppressing reduction in insulating properties of the oxide 41. This suppresses shunt failures.

Also, the oxide 42 has a thickness equal to or lower than 1 nm. Accordingly, an ion beam easily passes through the oxide 42. This allows the oxide 41, which is positioned deeper inside the memory cell MC than the oxide 42, to be partially removed by the ion beam passing through the oxide 42. That is, since the oxide 41 can be partially removed, a contribution of the oxide 41 to an occurrence of shunt failures is reduced. As a matter of fact, as shown in FIG. 12 and described above, if the oxide 42 has a thickness equal to or smaller than 1 nm, the shunt failure rate is significantly small.

Since the contribution of the oxide 41 to the occurrence of shunt failures is small, shunt failures do not easily occur even if the degree of oxidation of the oxide 41 is low. Thus, even if the oxidation of the mixed region 51 and the re-deposition layer 52 are weaker than oxidation of the mixed region 51*r* and the re-deposition layer 52*r* in a referential MTJ element MTJr, shunt failures of the MTJ element MTJ do not easily occur, compare to a shunt failure in the MTJ element MTJr. Accordingly, the oxidation of the mixed region 51 and the re-deposition layer 52 in the step shown in FIG. 7 can be performed weakly. This suppresses a portion of the reference layer 35 facing the tunnel barrier layer 36 from being oxidized similarly to the oxidized region 351, and suppresses a portion of the storage layer 37 facing the tunnel barrier layer 36 from being oxidized similarly to the oxidized region 371. It is thereby possible to supply write currents Iwp and Iwap of a sufficient magnitude to the MTJ element MTJ, unlike the MTJ element MTJr. Accordingly, write failures to the MTJ element MTJ do not easily occur compared to write failures to the MTJ element MTJr.

FIG. 13 shows a distribution of oxygen atoms in a referential MTJ element. FIG. 14 shows a distribution of oxygen atoms in an MTJ element according to the first embodiment. As described with reference to FIG. 12 and shown in FIG. 13, an oxygen concentration of a region ASr of the MTJ element MTJr is low; on the other hand, as shown in FIG. 14, an oxygen concentration of a region AS on a side surface of the MTJ element MTJ is higher than the oxygen concentration of the region ASr. Based at least in part on this, it has been found, according to the inventors' experiments, that the shunt failure rate of the MTJ element MTJ is 18.7% of the shunt failure rate of the MTJ element MTJr. Also, as described with reference to FIG. 12 and shown in FIG. 13, an oxygen concentration of a region AMr including the tunnel barrier layer 36*r* and its upper and lower regions is high; on the other hand, as shown in FIG. 14, an oxygen concentration of a region AM including a tunnel barrier layer 36 and its upper and lower regions of the MTJ element MTJ is lower than an oxygen concentration of the region AMr.

Through such a distribution of the oxygen concentration, the region AT of the MTJ element MTJ and the region ATr of the MTJ element MTJr have oxygen concentration distributions to be described below.

The region AT is formed of the tunnel barrier layer 36 and a region of the MTJ element MTJ beside the tunnel barrier layer 36. The region beside the tunnel barrier layer 36 is a portion (portions of the oxide 41 and the oxide 42) aligned with the tunnel barrier layer 36 along the x-axis.

The region ATr is formed of the tunnel barrier layer 36*r* and a region of the MTJ element MTJr beside the tunnel barrier layer 36*r*. The region beside the tunnel barrier layer 36*r* is a portion (oxide 41*r*) aligned with the tunnel barrier layer 36*r* along the x-axis.

As shown in FIG. 13, in the region ATr of the MTJ element MTJr, an oxygen concentration of the portion of the tunnel barrier layer 36*r* is high, and an oxygen concentration of the region beside the tunnel barrier layer 36*r* is lower than the oxygen concentration of the portion of the tunnel barrier layer 36*r*. On the other hand, in the region AT of the MTJ element MTJ, an oxygen concentration of the portion of the tunnel barrier layer 36 is low, and an oxygen concentration of the region beside the tunnel barrier layer 36 is higher than an oxygen concentration of the portion of the tunnel barrier layer 36. In particular, in the region AT, the oxygen concentration of the region beside the tunnel barrier layer 36 is higher than the oxygen concentration of a center of the tunnel barrier layer 36.

Also, based at least in part on the low oxygen concentration of the region AM of the MTJ element MTJ, the minimum resistance of the MTJ element MTJ is low, as shown in FIG. 15. FIG. 15 shows a relationship between a thickness of the oxide 42 and a minimum resistance of the MTJ element MTJ according to the first embodiment. The minimum resistance is, for example, an average of minimum resistance values denoted by a certain number of MTJ elements. FIG. 15 shows a minimum resistance in a given unit on a longitudinal axis. FIG. 15 shows an example in which the oxide 42 is an aluminum oxide.

As shown in FIG. 15, the minimum resistance is low. Also, it can be seen, from FIG. 15, that the minimum resistance is lower in the in-situ natural oxidation case than in the atmospheric oxidation case, and that the minimum resistance of the MTJ element MTJ becomes lower if oxidation of the mixed region 51 and the re-deposition layer 52 is weak. It has been found, according to the inventors' experiments, that the minimum resistance of the MTJ element MTJ is 44.7%, which is the minimum resistance of the MTJ element MTJr.

As described above, according to the first embodiment, it is possible to achieve both suppression of a shunt failure and suppression of a resistance increase.

1.5. Modifications

1.5.1. First Modification

FIG. 16 shows functional blocks of a memory device according to a first modification of the first embodiment. As shown in FIG. 16, a memory device 1*b* according to the first modification includes a memory cell array 11*b*. In the memory cell array 11*b*, a plurality of bit lines ¯BL are further positioned. A single bit line BL and a single bit line ¯BL configure a pair of bit lines. Each memory cell MCb is coupled to a single bit line BL and a single bit line ¯BL, and are coupled to a single word line WL.

FIG. 17 shows a circuit configuration of a memory cell according to the first modification of the first embodiment. As shown in FIG. 17, each memory cell MCb includes an MTJ element MTJ and a transistor TR. The transistor TR is, for example, an n-type metal-oxide-semiconductor field-effect transistor (MOSFET). The MTJ element MTJ is coupled, at a first end, to one of a source and a drain of the transistor TR. The MTJ element MTJ is coupled, at a second end, to a single bit line ¯BL. The other one of the source and the drain of the transistor TR is coupled to a bit line BL. A control terminal (gate electrode) of the transistor TR is coupled to a single word line WL.

FIG. 18 shows a cross section of an example structure of a memory cell according to the first modification of the first embodiment. As shown in FIG. 18, an interlayer insulator 64 is provided above an unillustrated semiconductor substrate. A conductor 65 is provided in the interlayer insulator 64. Each conductor 65 is coupled, at its lower end, to one of a pair of source/drain regions of a transistor TR (not illustrated) formed on a surface of the substrate. The other one of the source/drain regions of each transistor TR is coupled to a conductor that functions as a bit line BL.

An oxide 42A is positioned on an upper surface of the interlayer insulator 64. The oxide 42A is an oxide 42A formed in the step described above with reference to FIG. 9. That is, similarly to the configuration described above with reference to FIG. 8, an oxide 42A is formed on a side surface of the conductor 44, on a side surface of a cap layer 39, and on a surface of an oxide 41 of each memory cell MCb in the process of manufacturing. At the stage of this step, the oxide 42A is positioned partially on an upper surface of the interlayer insulator 64. At the time of partial removal of the oxide 42 by the same step described above with reference to FIG. 9, a portion on an upper surface of the interlayer insulator 64 of the oxide 42A remains. Etching of a structure below the MTJ element MTJ will not be performed thereafter. Accordingly, the oxide 42A remains on the upper surface of the interlayer insulator 64.

A single memory cell MCb is positioned on an upper surface of each conductor 65. The memory cell MCb includes the set of components included in the memory cell MC in the basic form of the first embodiment from which the switching elements SE have been removed. However, a silicon nitride 46*b* of each memory cell MCb extends over a surface of the oxide 42 of a memory cell MCb adjacent thereto. Furthermore, each silicon nitride 46*b* also covers the oxide 42A.

1.5.2. Second Modification

A structure that functions as a switching element SE may be positioned on an upper surface of a structure that functions as an MTJ element MTJ. FIG. 19 shows an example of such a case, and shows a cross section of an example structure of a memory cell according to a second modification of the first embodiment.

As shown in FIG. 19, each memory cell MCc of the second modification includes, at its lower portion, an MTJ element MTJ, and includes, at its upper portion, a switching element SE. The MTJ element MTJ is positioned on an upper surface of the conductor 21. The switching element SE is positioned on an upper surface of the storage layer 37. The switching element SE includes a variable resistance material 32*c*, and may further include a lower electrode 31*c* and an upper electrode 33*c*. The switching element SE has the shape of a truncated cone. The conductor 44 is positioned on an upper surface of the switching element SE. The oxide 42*c* is positioned on a side surface of the switching element SE, and covers, for example, a side surface of the switching element SE.

The oxide 42A is positioned on an upper surface of the conductor 21, similarly to the first modification. The oxide 42A is formed in the step described above with reference to FIG. 9. That is, similarly to the configuration described with reference to FIG. 8, an oxide 42A is formed on a side surface of the conductor 44, on a side surface of a switching element SE, and on a surface of an oxide 41 of each memory cell MCc in the process of manufacturing. At the stage of this step, the oxide 42A is positioned partially on an upper surface of the conductor 21. At the time of partial removal of the oxide 42A by the same step described above with reference to FIG. 9, a portion on an upper surface of the conductor 21 of the oxide 42A remains. Etching of a structure below the MTJ element MTJ will not be performed thereafter. Accordingly, the oxide 42A remains on the upper surface of the conductor 21.

As shown in FIG. 20, each memory cell MCc may include an electrode 55. The electrode 55 is positioned on an upper surface of the storage layer 37 and on an upper surface of the oxide 41. The electrode 55 covers, for example, the upper surfaces of the storage layer 37 and the oxide 41. The electrode 55 includes or consists of, for example, a titanium nitride. The lower electrode 31*c* is positioned on an upper surface of the electrode 55.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:

a first ferromagnetic layer;

a second ferromagnetic layer;

a first insulating layer between the first ferromagnetic layer and the second ferromagnetic layer;

a first oxide over a side surface of the first ferromagnetic layer, a side surface of the first insulating layer, and a side surface of the second ferromagnetic layer;

a second oxide provided over the first oxide, and including one of a magnesium oxide, an aluminum oxide, a silicon oxide, or an alkaline-earth metal oxide; and a silicon nitride over a side surface of the second oxide, wherein the first oxide includes an oxide of at least one element included in at least one of the first ferromagnetic layer, the first insulating layer, and the second ferromagnetic layer.

2. The device according to claim 1, wherein the second oxide has a thickness equal to or smaller than 1 nm.

3. The device according to claim 1, wherein the second oxide is positioned on a surface of the first oxide opposite to a surface of the first oxide facing the first ferromagnetic layer, the first insulating layer, and the second ferromagnetic layer.

4. The device according to claim 1, further comprising:

a conductor on a side of the first ferromagnetic layer opposite to the first insulating layer along a first direction;

an insulator aligned with the conductor along a second direction intersecting the first direction; and a third oxide provided on the insulator and including the one of the magnesium oxide, the aluminum oxide, the silicon oxide, or the alkaline-earth metal oxide.

5. The device according to claim 1, further comprising:

a conductor on a side of the first ferromagnetic layer opposite to the first insulating layer along a first direction, and contacting the first ferromagnetic layer; and a third oxide provided on the conductor, and including the one of the magnesium oxide, the aluminum oxide, the silicon oxide, or the alkaline-earth metal oxide.

6. A memory device comprising:

a first ferromagnetic layer;

a second ferromagnetic layer;

a first insulating layer between the first ferromagnetic layer and the second ferromagnetic layer;

a first oxide over a side surface of the first ferromagnetic layer, a side surface of the first insulating layer, and a side surface of the second ferromagnetic layer;

a second oxide provided over the first oxide, and including one of a magnesium oxide, an aluminum oxide, a silicon oxide, or an alkaline-earth metal oxide; and a silicon nitride over a side surface of the second oxide, wherein an oxygen concentration of a portion of the first insulating layer facing the second oxide is higher than an oxygen concentration of a central portion of the first insulating layer.

7. The device according to claim 6, wherein the first oxide includes an oxide of at least one element included in at least one of the first ferromagnetic layer, the first insulating layer, and the second ferromagnetic layer.

8. The device according to claim 6, wherein the second oxide is positioned on a surface of the first oxide opposite to a surface of the first oxide facing the first ferromagnetic layer, the first insulating layer, and the second ferromagnetic layer.

9. The device according to claim 6, further comprising:

a conductor on a side of the first ferromagnetic layer opposite to the first insulating layer along a first direction;

an insulator aligned with the conductor along a second direction intersecting the first direction; and a third oxide provided on the insulator and including the one of the magnesium oxide, the aluminum oxide, the silicon oxide, or the alkaline-earth metal oxide.

10. The device according to claim 6, further comprising:

a conductor on a side of the first ferromagnetic layer opposite to the first insulating layer along a first direction, and contacting the first ferromagnetic layer; and a third oxide provided on the conductor, and including the one of the magnesium oxide, the aluminum oxide, the silicon oxide, or the alkaline-earth metal oxide.

* * * * *